(12) United States Patent
Nysen

(10) Patent No.: US 8,049,671 B2
(45) Date of Patent: Nov. 1, 2011

(54) ANTENNA CONFIGURATIONS FOR COMPACT DEVICE WIRELESS COMMUNICATION

(75) Inventor: Paul A. Nysen, Pala, CA (US)

(73) Assignee: Sierra Wireless, Inc., Richmond, BC (CA)

( * ) Notice: Subject to any disclaimer, the term of this patent is extended or adjusted under 35 U.S.C. 154(b) by 592 days.

(21) Appl. No.: 12/203,875

(22) Filed: Sep. 3, 2008

(65) Prior Publication Data

US 2009/0115672 A1    May 7, 2009

Related U.S. Application Data

(60) Provisional application No. 60/967,449, filed on Sep. 4, 2007.

(51) Int. Cl.
*H01Q 1/00* (2006.01)

(52) U.S. Cl. .......... 343/730; 343/727; 343/729

(58) Field of Classification Search .......... 343/702, 343/725, 727, 729, 730
See application file for complete search history.

(56) References Cited

U.S. PATENT DOCUMENTS

| | | | |
|---|---|---|---|
| 4,087,823 A | 5/1978 | Faigen et al. | |
| 4,737,789 A | 4/1988 | Nysen | |
| 5,420,599 A * | 5/1995 | Erkocevic | 343/828 |
| 5,434,396 A | 7/1995 | Owen et al. | |
| 5,532,708 A | 7/1996 | Krenz et al. | |
| 5,691,735 A | 11/1997 | Butland et al. | |
| 5,771,024 A * | 6/1998 | Reece et al. | 343/725 |
| 5,784,032 A | 7/1998 | Johnston et al. | |
| 5,828,346 A | 10/1998 | Park | |
| 5,990,838 A | 11/1999 | Burns et al. | |
| 6,046,700 A * | 4/2000 | Kitchener et al. | 343/725 |
| 6,140,972 A | 10/2000 | Johnston et al. | |
| 6,150,983 A | 11/2000 | Massey | |
| 6,172,645 B1 | 1/2001 | Hollander et al. | |
| 6,222,494 B1 * | 4/2001 | Erkocevic | 343/790 |
| 6,285,336 B1 | 9/2001 | Zimmerman | |
| 6,339,404 B1 * | 1/2002 | Johnson et al. | 343/794 |
| 6,356,242 B1 | 3/2002 | Ploussios | |
| 6,448,933 B1 * | 9/2002 | Hill et al. | 343/702 |
| 6,498,939 B1 | 12/2002 | Thomas | |
| 6,691,735 B1 | 2/2004 | Harneit | |
| 6,812,902 B2 | 11/2004 | Rossman et al. | |

(Continued)

FOREIGN PATENT DOCUMENTS

CA    2358877 A    6/2001

(Continued)

OTHER PUBLICATIONS

Office Action in U.S. Appl. No. 12/203,900, mailed Sep. 30, 2010.

(Continued)

*Primary Examiner* — Tho G Phan
(74) *Attorney, Agent, or Firm* — Nixon Peabody LLP

(57) ABSTRACT

A diversity antenna for use with a portable host device such as a laptop computer, for example as part of a PCMCIA card pluggable into the laptop computer to enable wireless computer by the laptop computer, includes a main antenna and a diversity antenna. Various configurations for these antennas are possible, including the use of a balanced dipole as the main antenna element and a split diversity antenna for the diversity antenna element. The diversity antenna provides high isolation between the antenna elements and isolation from interfering self-noise generated by the host device.

10 Claims, 28 Drawing Sheets

U.S. PATENT DOCUMENTS

| | | | |
|---|---|---|---|
| 7,023,909 | B1 | 4/2006 | Adams et al. |
| 7,069,043 | B2 | 6/2006 | Sawamura et al. |
| 7,132,988 | B2 | 11/2006 | Yegin et al. |
| 7,183,994 | B2 | 2/2007 | Weigand |
| 7,271,779 | B2 | 9/2007 | Hertel |
| 7,916,090 | B2 | 3/2011 | Nysen |
| 7,952,528 | B2 | 5/2011 | Nysen |
| 2004/0100407 | A1 | 5/2004 | Okado |
| 2005/0156796 | A1 | 7/2005 | Nysen |
| 2007/0052587 | A1 | 3/2007 | Cheng |
| 2007/0152891 | A1 | 7/2007 | Fabrega-Sanchez et al. |
| 2008/0024349 | A1 | 1/2008 | Bhagat et al. |
| 2008/0169992 | A1 | 7/2008 | Ortiz et al. |
| 2009/0115670 | A1 | 5/2009 | Nysen |
| 2009/0115672 | A1 | 5/2009 | Nysen |
| 2009/0115673 | A1 | 5/2009 | Nysen |
| 2009/0121947 | A1 | 5/2009 | Nysen |
| 2009/0121948 | A1 | 5/2009 | Nysen |
| 2009/0124215 | A1 | 5/2009 | Nysen |

FOREIGN PATENT DOCUMENTS

| | | | |
|---|---|---|---|
| CA | 2449328 | A1 | 5/2005 |
| CA | 2554152 | A | 7/2005 |
| CA | 2499328 | A1 | 9/2006 |
| EP | 1148584 | A2 | 3/2001 |
| KR | 10-2007-0007343 | A | 1/2007 |
| WO | 2006120250 | A2 | 11/2006 |

OTHER PUBLICATIONS

Office Action in U.S. Appl. No. 12/203,892, mailed Jun. 15, 2010.
Office Action from U.S. Appl. No. 12/203,890, dated Jun. 9, 2010.
International Search Report, PCT/CA2008/001573, dated Nov. 19, 2008.
International Search Report, PCT/CA2008/001574, dated Dec. 31, 2008.
International Search Report, PCT/CA2008/001577, dated Dec. 10, 2008.
International Search Report, PCT/CA2008/001578, dated Nov. 26, 2008.
International Search Report, PCT/CA2008/001579, dated Nov. 20, 2008.
International Search Report, PCT/CA2008/001580, dated Nov. 27, 2008.
International Search Report, PCT/CA2008/001581, dated Nov. 20, 2008.
Notice of Allowance from U.S. Appl. No. 12/203,900, dated Jun. 14, 2010.
Office Action from U.S. Appl. No. 12/203,892, dated Jun. 15, 2010.
Office Action in U.S. Appl. No. 12/203,898, mailed Jun. 6, 2011.
Non-Final Rejection in Korean Patent Application No. 10-2010-7007184, dated Jul. 14, 2011.

* cited by examiner

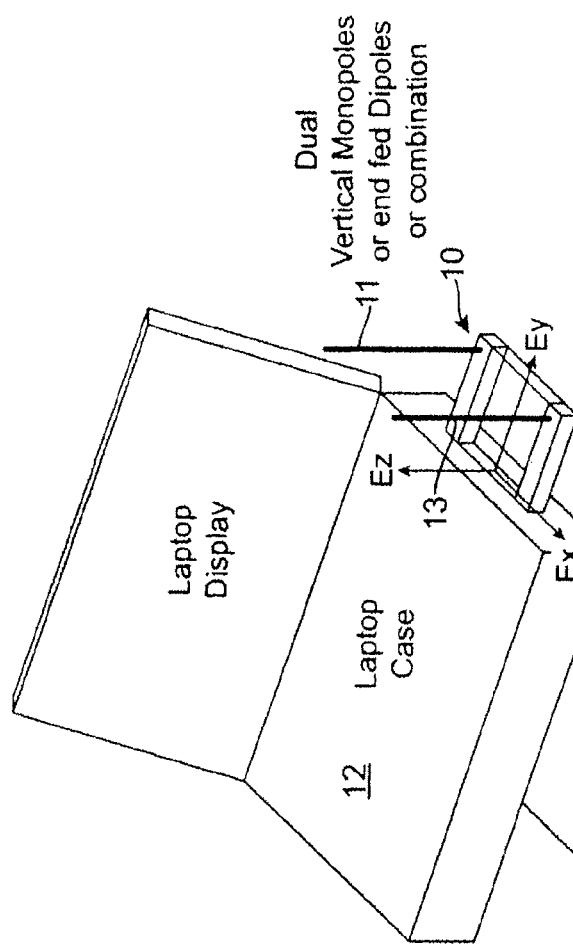
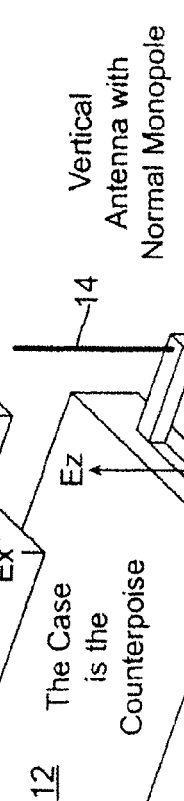
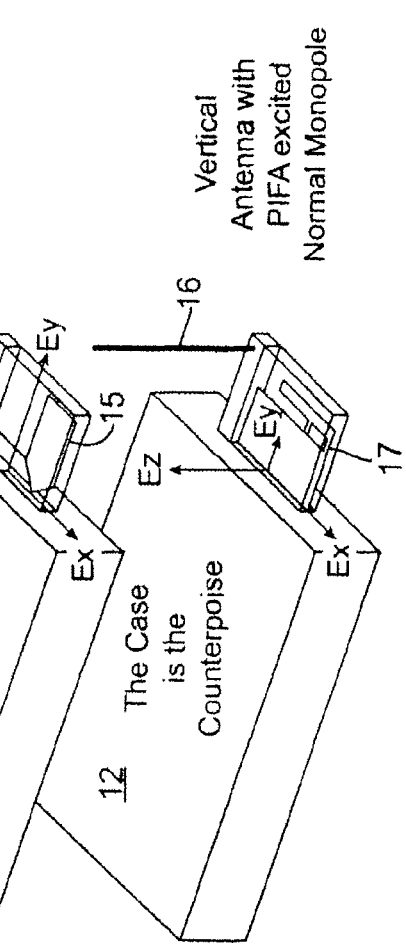
FIG. 1a (PRIOR ART)
FIG. 1b (PRIOR ART)
FIG. 1c (PRIOR ART)

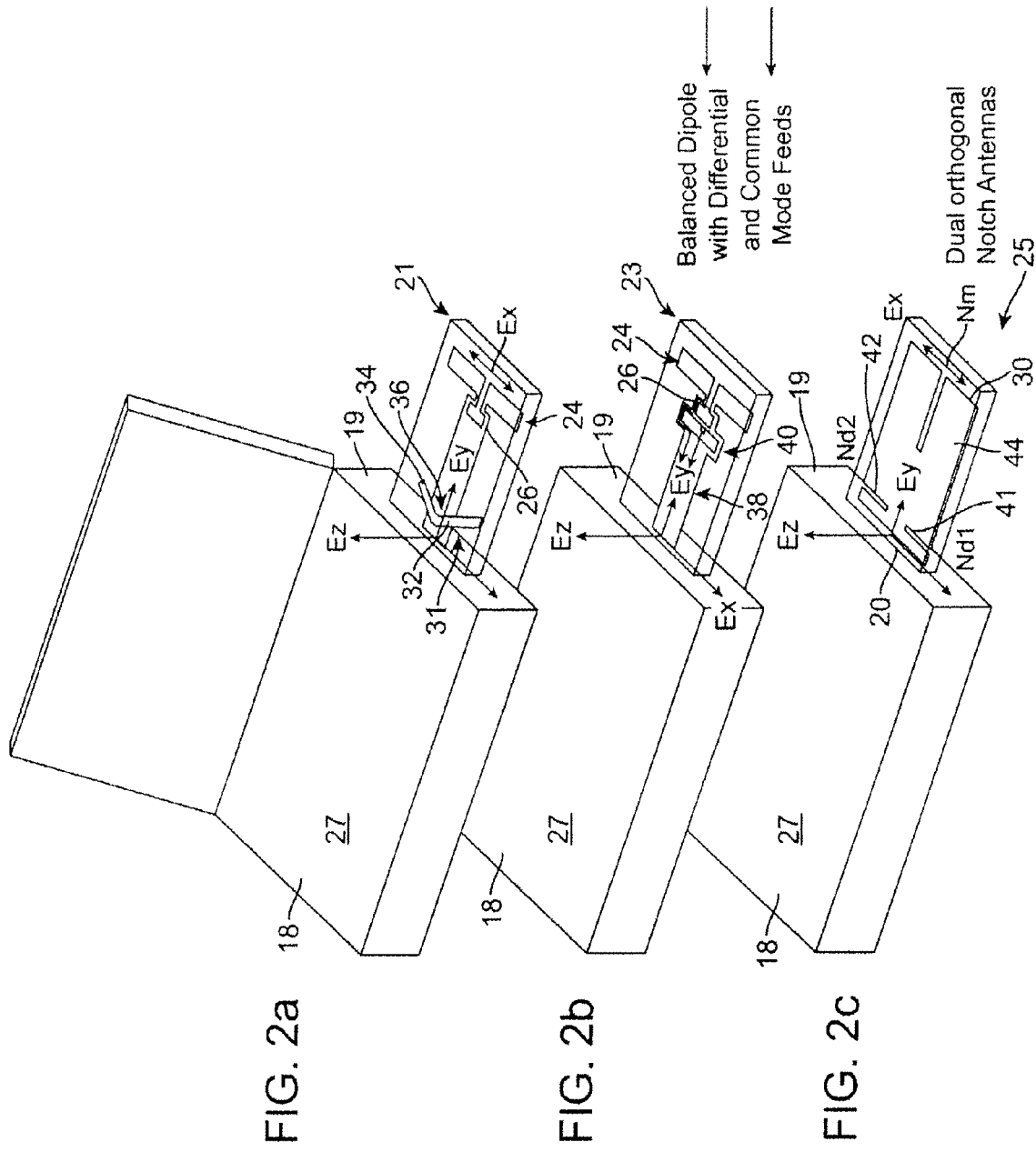

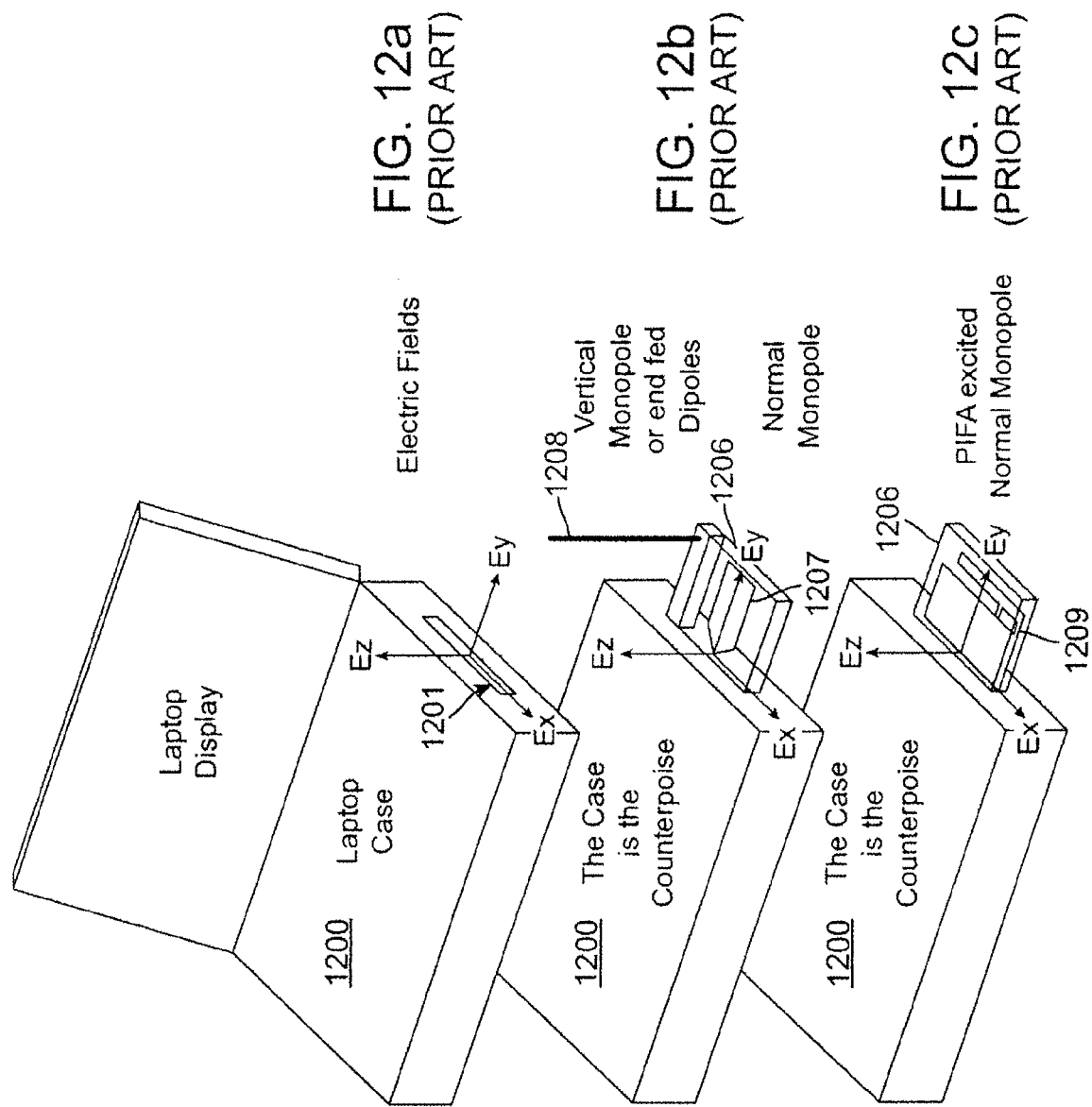

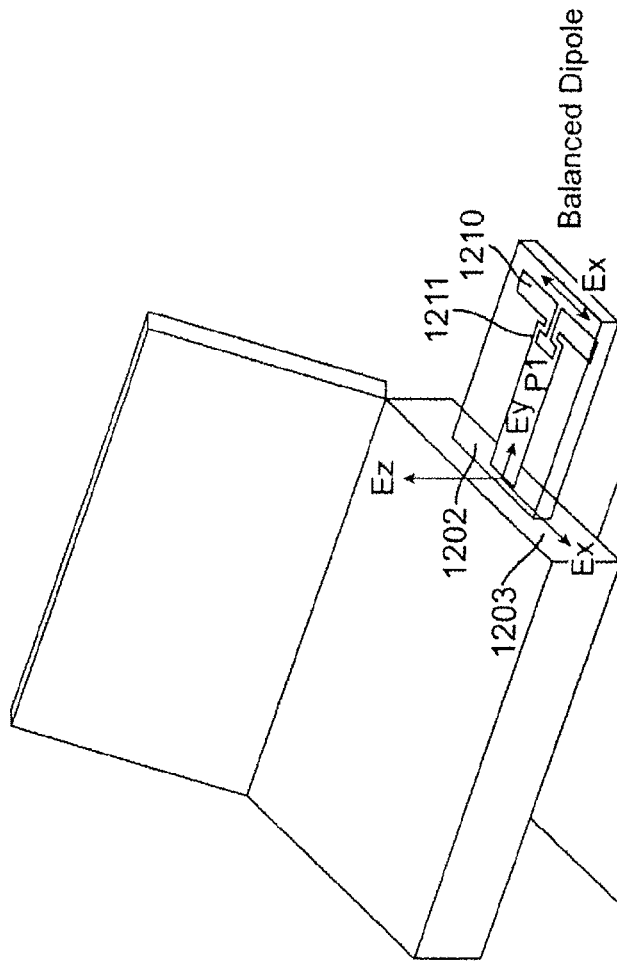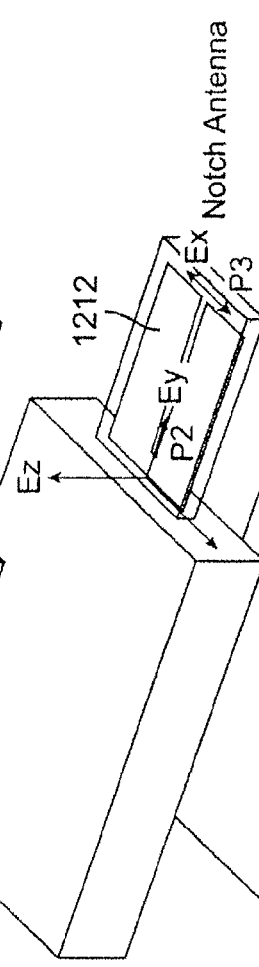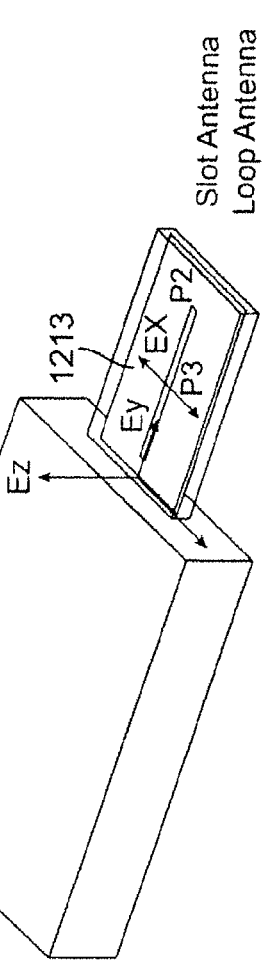

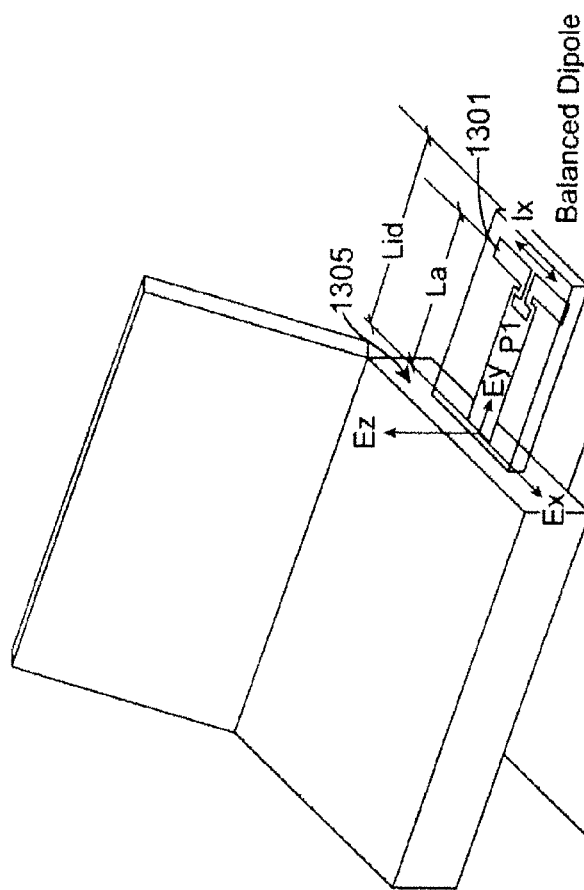
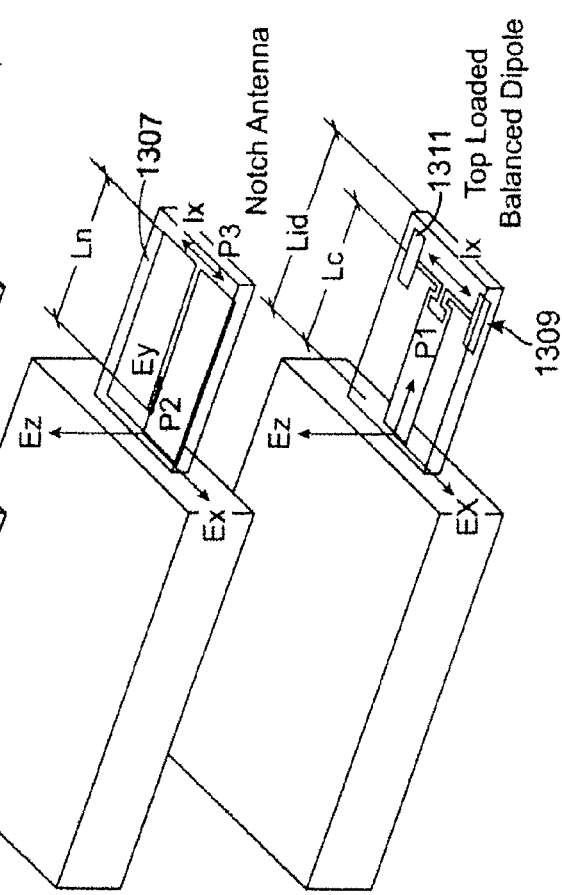

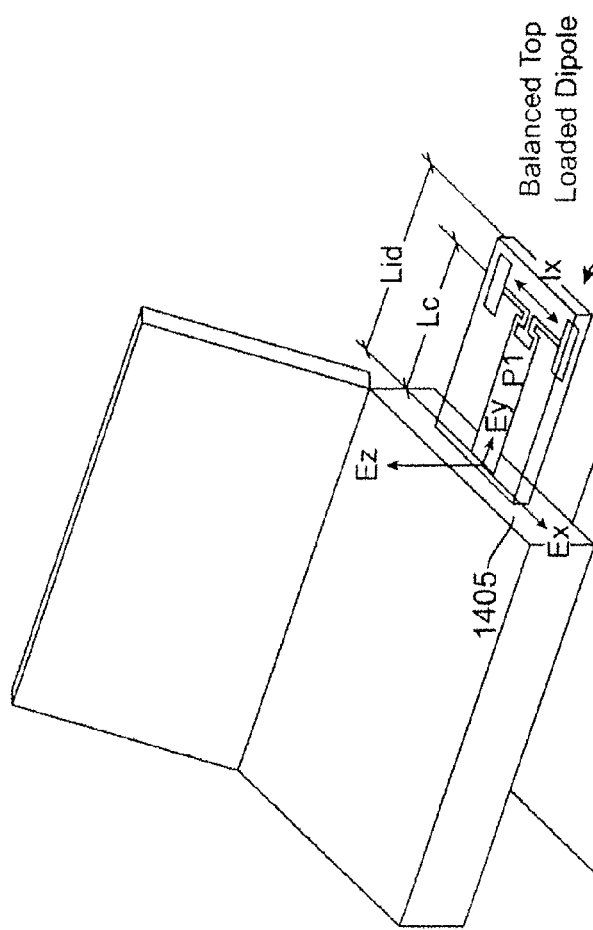
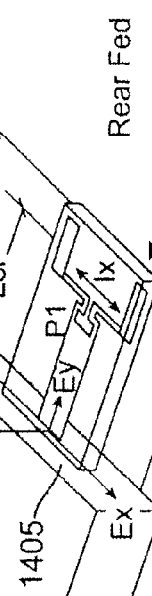
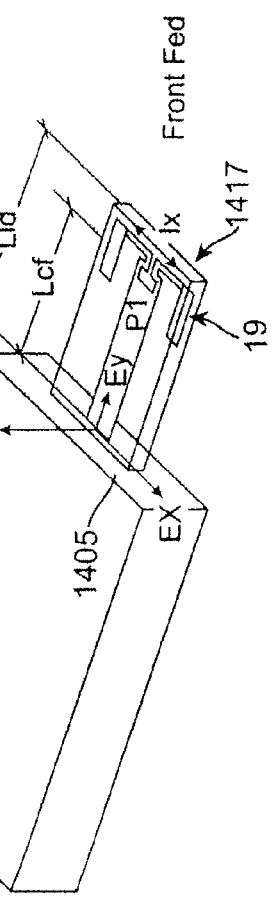
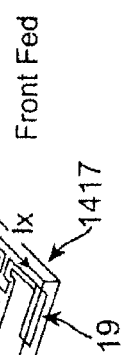
FIG. 14a
FIG. 14b
FIG. 14c

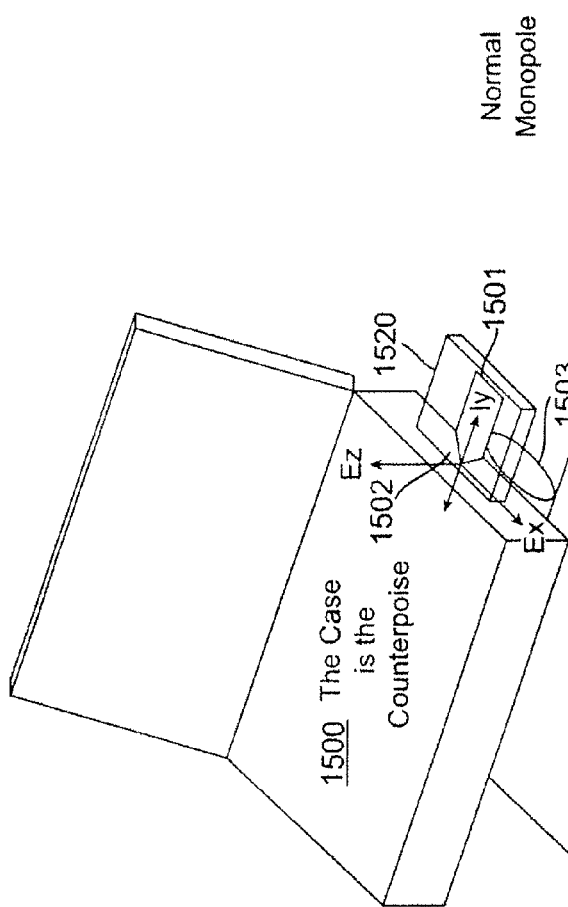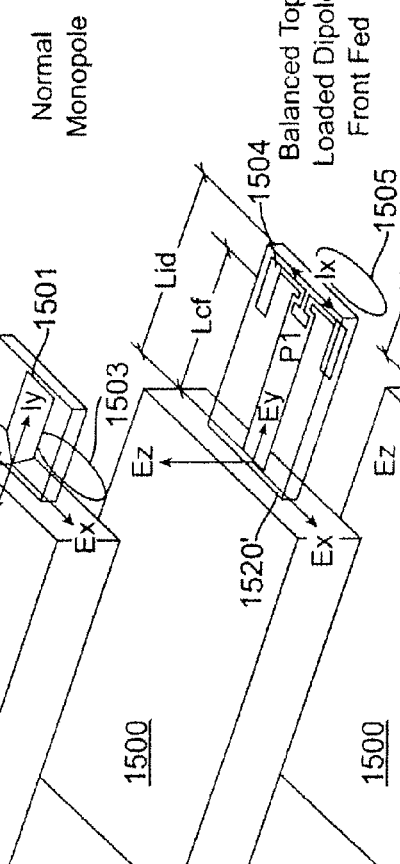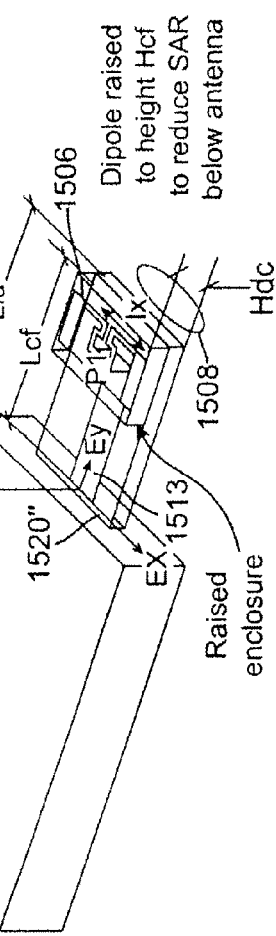
FIG. 15a (PRIOR ART)
FIG. 15b (PRIOR ART)
FIG. 15c SIDE VIEW of SEVERAL ANTENNA CONFIGURATIONS

ANTENNA CONFIGURATIONS FOR COMPACT DEVICE WIRELESS COMMUNICATION

CROSS REFERENCE TO RELATED APPLICATIONS

This application claims the benefit of U.S. Provisional Patent Application No. 60/967,449, filed on Sep. 4, 2007, entitled "Antenna Systems", the disclosure of which is hereby incorporated by reference for all purposes.

BACKGROUND OF THE INVENTION

1. Field of the Invention

The invention relates to antennas for use with portable and other computing devices, such as laptop computers. More specifically, it relates to antennas that may be part of removable components such as PCMCIA (personal computer memory card international association) cards or the like that provide wireless communication to the computing devices.

2. Description of the Related Art

Some computing devices, such as laptop computers, may not be manufactured with wireless communication capability. Rather, some of these devices may have slots or similar coupling locations into which wireless communication devices may be mated to provide the host computing device with wireless capability. The wireless communication device can be for example a PCMCIA (personal computer memory card international association) card, and can include a transceiver and other circuitry coupled to an antenna and matable with the host device to provide wireless communication capability thereto. While explained herein in terms of a laptop computer as the host device, and a PCMCIA card as the wireless communication device, it will be appreciated that the invention is not so limited, and other host devices, such as PDAs and desktop computers, and other wireless communication devices for establishing wireless communication through a cellular network or through Bluetooth, WiFi and other types of wireless links and channels are also contemplated.

Diversity antennas used with wireless communication devices, especially portable and mobile devices, are very beneficial in improving the quality of the received signal in a wireless communications receiver. Typical diversity antenna systems consist of a main antenna and a diversity antenna, although there could be more than one diversity antenna. The initial benefit of diversity comes from the de-correlation of the fading between two separate antenna systems. The antennas can be spatially separated and/or use orthogonal polarizations (i.e. vertical and horizontal polarizations, right and left circular polarization, etc.) During a fade, the signal strength is degraded to the point that long error bursts occur in the received signal, severely degrading the overall received radio throughput, amongst other degradations. Diversity helps alleviate this problem by having two antennas separated in space and/or polarization, providing two nearly independent receive signal channels or paths which do not experience fades in the same way (that is, they are de-correlated). Thus while one antenna may experience a deep fade the other antenna may be within 3 dB of its nominal signal level. The result of this is that links with rapid fading that can go −15 dB or more below the average signal strength in a fade on a single channel system (non-diversity) but may be reduced to only −4 dB or −5 dB below the average signal strength with diversity on a statistical basis. In this example, diversity would provide an effective gain of 11 dB to 10 dB. Thus the reduced loss of signal prevents the channel from being dropped far less frequently than it would with a single deep fading channel. Typically the diversity antenna may be separated by as little as one eighth of a wavelength and still experience a significant gain over a single channel non-diversity antenna.

FIG. 1a shows a simple two antenna diversity system used on a PCMCIA (personal computer memory card international association) card 10 in a laptop computer 12, in which two vertical dipoles or monopoles (11 and 13) are employed. In FIG. 1b, an orthogonal dipole/monopole configuration is shown that uses a vertical monopole/dipole 14 with horizontal monopole 15 disposed normal to the side of the laptop case. In FIG. 1c, the horizontal monopole is replaced with a PIFA (Planar Inverted-F Antenna) style antenna 17 and a vertical antenna 16. Both the PIFA and the horizontal monopole use the laptop case as the "counterpoise" for the associated antenna system. An "antenna counterpoise" is a virtual ground for balancing the currents in the antenna by establishing a zero reference potential for feeding the active antenna element. It can be any structure closely associated with (or act as) the ground which is connected to the terminal of the signal receiver or source opposing the active antenna terminal, (that is, the signal receiver or source is interposed between the active antenna and this structure). The "antenna counterpoise" may be directly, capacitively or inductively coupled to the surrounding ground plane if there happens to be one there.

One of the main disadvantages of these sample diversity systems is the generally poor isolation between the antennas, sometimes as low as a few dB but typically only 6 dB. With diversity isolations greater that 10 dB being preferred, consideration may be given to improved orthogonality between these antennas to increase the diversity isolation. Higher diversity isolation essentially means less correlation between the separate antennas and therefore a reduced probability of destructive interference or fading.

Another consideration is the interactions between a dipole like-antenna and an orthogonal dipole/monopole with a substantially symmetrical geometry normal to the main dipole length vector. Small form factor wireless communications devices, such as PCMCIA cards, provide very limited external space to include antennas with high efficiency, wide bandwidth, multiple bands and diversity all at the same time. This tight space constraint results in interaction between the various antenna elements, even if the antennas have good isolation between the selected paths or "ports." This is further complicated by the interaction between the various antenna systems and the computer or platform to which the card is mated.

Thus one consideration is the fabrication of a high performance main and diversity antenna system for use in a PCMCIA card, with the aim of achieving good antenna efficiency with high isolation between the main and diversity antennas and high isolation between the main antenna and the radiated self-noise from the host device (for example lap top computer), while maintaining an acceptable industrial design (ID) appearance. These results are ultimately reflected in the Total Isotropic Sensitivity (TIS) and Total Radiated Power (TRP) performance of the antenna.

Optimum dipole location for minimum laptop self-noise is another consideration. Laptop computers have traditionally been designed primarily for user computer functionality and conformity with FCC part 15 regulations. In more recent times, functionality has been expanded to include wireless network connections such as cellular communications and WiFi. Since the FCC part 15 requires only radiated noise limitations, the issue of self-noise for added or integrated wireless network solutions has not been considered. Consequently, while compliance with FCC part 15 has been achieved, there are high levels of RF surface currents and RF voltage antinodes all over laptop computers. Furthermore, laptop computers now can have prescribed locations at which PCMCIA cards and similar devices can be added after-market, and these locations have become the location for accommodating wireless solutions. The concern is that self-RF noise generated or reaching in these locations de-senses the receiver part of the transceiver. Radiation in the PCMCIA slot regions may be substantially vertically polarized, and conduction currents from the laptop chassis generate conduction noise into antenna structures, such as the traditional monopole, that use the chassis as the substantial counterpoise for the antenna. This latter case can be the main mode of self-noise for PCMCIA-based wireless modems. The lowest noise is generated in the region of the PCMCIA slot in the E-field direction parallel to the long edge of the slot opening in the laptop.

FIGS. 12a-12c show a typical laptop computer with a PCMCIA or other PC card slot 1201 in the side wall of the laptop 1200. The electric fields Ex, Ey and Ez are shown as indicated. FIGS. 12b and 12c show conventional antenna configurations as currently employed. The extension of the PCMCIA card 1206, 1206' outside of the slot is shown. In FIG. 2b, the antenna 1207 is in the form of a typical monopole antenna that uses the laptop chassis as its counterpoise, and the antenna 1208 is in the form of a vertical antenna that can be a monopole that uses the chassis as its counterpoise, or the antenna could be made longer and configured as an end-fed dipole that is only weakly coupled into the chassis. Antenna 1209 is in the form of a PIFA (Planar Inverted-F Antenna). This style of antenna excites currents and voltage antinodes in the associated ground plane, which acts as a counterpoise to the PIFA. Put simply, the PIFA is a wide monopole that excites the ground plane.

With the exception of the end-fed dipole antenna, all of the antennas of FIGS. 12a-12c suffer from conducted RF noise from the chassis or ground plane of the computer. The end-fed dipole operates best when excited at a low impedance point on the ground plane or chassis. Since this dipole antenna is end-fed, it represents a very high impedance to the ground plane and hence reduces the conducted noise to the dipole.

Optimum dipole location and shape for maximum bandwidth in a small volume is another consideration. Almost all laptop computers today have at least one slot available for mating a PCMCIA card or similar device to the laptop computer. The extent of the projection of a PCMCIA card outside the slot in the side of the laptop is primarily limited by aggressively small industrial design (ID) constraints that have little concern for the needs of RF antenna functionality. Additional constraints are imposed by the mechanical enclosure and its requirements for welding line wall thickness and studs and so forth.

The size of an antenna enclosure has the greatest influence on the antenna performance at the lowest required operating frequency. For an ideal fat dipole the optimum length is $0.45\lambda$, with $\lambda$ being the wavelength of the interest. However, for cell-phone applications, adequate performance can be achieved with top-loaded dipoles or fat dipoles with a length as short as $0.30\lambda$. Antennas as short as $0.125\lambda$ require significant top-loading and often require sophisticated matching circuits to achieve the necessary bandwidth.

In addition, the location of a dipole antenna near a significant ground plane also impacts the bandwidth and performance of a dipole antenna. By way of example, a Yagi antenna requires a minimum separation of reflector from the driven element (typically a dipole) of $0.04\lambda$. The optimum separation is $0.15\lambda$ to $0.25\lambda$ with adequate performance as close as $0.09\lambda$. As the separation decreases below $0.25\lambda$, the front to back ratio decreases to unity and the bandwidth also decreases.

By way of example, Novatel™, in the C110 Type II PCMCIA card, uses a Yagi style antenna with the ground plane of the PCMCIA card as the reflector, a balun-fed dipole, and a director in order to operate above 1.90 GHz in a cellular application. The spacing between elements is nominally at the minimum of $0.04\lambda$ as a result of needing to fit within an overall length of 22 mm. This antenna is integral with the main PCB (printed circuit board) and requires no external antenna components. The folded nature of the antenna elements reflect the struggle to achieve a match even at this high frequency, let alone attempting a solution at 0.824 GHz. The very nature of this three-element Yagi design renders a 0.824 GHz solution extremely inefficient and/or limited bandwidth.

Optimum dipole location and style for minimum specific absorption rate (SAR) in a small volume is yet another consideration. SAR is a direct measure of the amount of RF power absorbed into human tissue due to a transmitting device in close proximity to it. This is a particularly important mobile phone issue as the transceivers of the device are employed in close proximity to the operator's head. The required standards and conditions for the measurement of SAR are defined and regulated by the FCC. There are several basic approaches to SAR reduction:

1. Reduce the radiated RF power
2. Place a screen between the radiator and the tissue
3. Place a resonant reflector between the radiator and the tissue
4. Use an antenna design with a significant front-to-back ratio, pointing the null towards the tissue.
5. Increase the separation distance between the radiator and the tissue
6. Spread out the surface current more over the radiator, particularly close to the radiator feed point in the case of a dipole or a monopole.

While these seem like simple remedies they each come with a cost, and a trade-off is required that usually impacts either industrial design (ID) and/or antenna and system performance.

Most traditional PCMCIA or PC cards are designed with a single PCB in mind, with antenna assemblies added to the outside edge of the card. The antenna elements typically comprise monopole antennas, whip antennas or PIFA (planar inverted-F antenna) antennas. Some use a coplanar dipole as the radiator, but this has been the choice of expedience of parts and of having a minimum vertical profile. This latter application, if used at all, has mostly been used at 1.8 GHz and above, due the unacceptable size of the antenna at lower frequencies such as 850 MHz.

The SAR "hot spot" most typically occurs close to, if not directly under, the feed point for the antenna. FIG. 15a shows a normal monopole 1501 used in a PCMCIA card 1520 in a laptop computer 1500. The antenna feed point 1502 is at the intersection point between the laptop 1500 case and the monopole 1501. Directly below this point and in the near surface of the tissue of the operator is where the "hot spot" 1503 will usually be found. The same result occurs for a whip antenna, whether normal or vertical at the feed point. The use of a standard dipole 1504 is shown in FIG. 15b, with its associated SAR "hot spot" at 1505 beneath the dipole. In some cases a Yagi antenna can be used in lieu of the dipole, to achieve some SAR reduction.

Inductive coupling between the antenna assembly and the printed circuit board (PCB) is another consideration. In some situations, it may be desirable to use such inductive coupling. An inductive coupling arrangement can be useful with air core transformers having only a few turns on both primary and secondary sides, for instance. However, such air-cored transformers have significantly more flux leakage than a high Mu ferrite-cored transformer. This flux leakage constitutes the uncoupled magnetic flux that does not pass through both coils. The consequence of this leakage is to produce an uncoupled inductance called leakage inductance. This acts in series with both the primary and secondary sides of the transformer, whereas the common inductance is called the mutual inductance and accounts for the magnetic field that is accepted by both sides of the transformer. While the leakage inductance is often perceived as loss, it is in fact conservative and can be cancelled out by using series capacitance or shunt capacitance. The main issue is that if the leakage (uncoupled) inductance exceeds the mutual inductance, the capacitive tuning required will result in a narrower band coupling.

The simplest design rule to minimize the flux leakage is to widen the trace width and to push the two windings as close together as possible. Once the gap-to-width ratio drops below 0.2, the leakage inductance becomes much less that the mutual inductance.

An advantage of the use of inductive coupling is that it simplifies the interconnection between two RF circuits, which, in the case of an antenna assembly, is between the PCB containing the bulk of the circuitry and the FPCB (flexible printed circuit board) of the antenna element(s). The inductive coupling eliminates the need for direct soldering, coaxial connection, zif sockets or pogo pins, etc. The perceived disadvantage is the leakage inductance and the size of the coupling loops, which is directly related to the maximum operating wavelength.

Reference is first made to FIG. 16a, in which conventional arrangement in which a balun 1601 on a main PCB 1630 is used to drive the antenna (not shown) or other balanced device in a differential manner. Balun 1601 is connected directly to a balanced antenna feed system 1603 via a gap port 1602. This interconnect is typically soldered, RF connected, pogo pinned, zif connected or facilitated by some other mechanical device or means (not shown). Next, in FIG. 16b, there is shown a conventional arrangement in which the connection of a dipole 1606 is via a feed line 1605 to a balun 1604. The balun is disposed on PCB 1630'. The gap exists at the balun-to-feed system transition. This gap can be coupled to the RF system by micro-strip or strip-line across the gap. The balun 1604 is made large enough to establish an adequate amount of inductive reactance so that the system does not become too low in impedance.

Dual band gap split duplexer and/or matching is also a consideration. Balanced RF feed systems are often a consequence of symmetrical RF modules such as antennas, mixers, differential/push pull amplifiers, coplanar waveguides and other such devices. Solutions as described herein are applicable to all these areas, even thought the principle focus is for antenna applications and balun structures including inductive/transformer coupling.

With reference to FIGS. 17a-17e, conventional gap port feed systems are described. In FIG. 17a, it is gap 1702 across a balun 1701; in FIG. 17b, it is in a notch 1704 of a notch antenna 1703; and in FIG. 17c it is across the central region of a closed end slot 1706 of a notch antenna 1705.

The gap port defines the excitation region of the selected balanced RF system. The gap port is the subject of the transition from the balanced to the unbalanced RF circuit that needs to be connected to the antenna/balun. It should be understood that the edge opposite to the gap on the balun may be connected to a large or larger ground plane on which the RF circuits reside and still maintain the balanced/symmetrical condition. The balance remains as long as the attached ground plane is attached symmetrically to the balun even if it connects to the two adjacent sides as well.

FIG. 17d is an isometric view showing how a slot (or gap) 1708 in a ground plane is typically connected into a strip line 1709 feed system in an antenna system 1707. In the system 1707, the strip line 1709 connects to the opposite side of the gap/slot from where the line came from. In the side view of FIG. 17e, it is seen where the slot 1708 is coupled in a short circuit to the strip line 1709 at a point 1713 opposite on the slot. A similar configuration is shown in FIG. 17f, but in this case the strip line 1709' passes across the slot 1708' and beyond it by a distance of one quarter of a wavelength, ending in an open circuit. This well-practiced principle in strip line RF design shown in FIG. 17f effectively achieves a short circuit as in the location 1713 in FIG. 17e without the necessity of a direct electrical connection. This methodology finds its greatest use for the excitation of slot or notch antennas and also for the excitation of patch on slot antennas.

BRIEF SUMMARY

Described herein is a dual diversity antenna system with orthogonal dipole and monopole elements designed to have a substantially symmetrical pattern, high efficiency, high isolation between the diversity elements, and reduced sensitivity to nearby sources of electromagnetic interference.

As described herein, a diversity antenna system for use with a host device and configured to provide isolation from radiated self-noise by the host device and to minimize interactions between antenna elements of the diversity antenna system. The diversity antenna system includes a ground plane, a main antenna coupled to the ground plane and having a common mode feed, and a diversity antenna having first and second arms extending from the common-mode feed of the main antenna.

Also described herein is a diversity antenna system for use with a host device and configured to provide isolation from radiated self-noise by the host device and to minimize interactions between antenna elements of the diversity antenna system. The diversity antenna system includes a ground plane, a main antenna including a first portion of the ground plane and a first notch formed in the first portion, and a diversity antenna including a pair of balanced notches formed is a second portion of the ground plane.

Also described herein is a diversity antenna system for use with a host device and configured to provide isolation from radiated self-noise by the host device and to minimize interactions between antenna elements of the diversity antenna system. The diversity antenna system includes a ground plane, a main antenna, a diversity antenna orthogonal to the main antenna, and a double balun configured to provide independent feeds to the main and diversity antennas.

Also described herein is a diversity antenna system for use with a host device having a ground plane, the diversity antenna system being configured to provide isolation from radiated self-noise by the host device and to minimize interactions between antenna elements of the diversity antenna system. The diversity antenna system includes a main antenna, a diversity antenna orthogonal to the main antenna, a first balun coupled to the main antenna, and a jumper configured as a second balun for exciting a common mode of the main antenna.

Also described herein is a diversity antenna system for use with a host device having a ground plane and a case, the diversity antenna system being configured to provide isolation from radiated self-noise by the host device and to minimize interactions between antenna elements of the diversity antenna system. The diversity antenna system includes a main antenna coupled to the ground plane, a balun having a gap and coupled to the main antenna, a common mode feed for the main antenna, the common mode feed configured to excite the gap of the balun, and a diversity antenna having first and second arms extending from the common mode feed, the diversity antenna being configured to use the case as a counterpoise.

BRIEF DESCRIPTION OF THE SEVERAL VIEWS OF THE DRAWINGS

In the drawings:

FIGS. 1a-1c are schematic views of various known diversity antenna configurations.

FIGS. 2a-2c show three sets of balanced symmetrical antenna systems that are orthogonal.

FIG. 4b is a schematic diagram depicting the magnetic potential flow of the antenna system of FIG. 4a.

FIGS. 8a-8b show the details of an antenna assembly for use in the PCMCIA card of FIGS. 7a-7b or the like.

FIGS. 9a-9b show further details of an antenna assembly for use in the PCMCIA card of FIGS. 7a-7b or the like.

FIGS. 12a-12c show a laptop compute and various prior art antenna configurations for use therewith.

FIGS. 12d-12f are isometric views relating to optimum antenna placement in a PC card mated to a laptop computer.

FIGS. 13a-13c and 14a-14d are isometric views relating to optimum dipole antenna placement in a PC card mated to a laptop computer.

FIGS. 15a-15b are isometric views showing hotspot locations for pc cards in use in a laptop computers to which they are mated.

FIGS. 15c-15e show pc cards in which portions of the antenna assembly and/or pc card housing are raised to reduce hotspots.

FIG. 22 is a prior art block diagram of a pc card or the like.

DETAILED DESCRIPTION

The description herein is provided in the context of antenna configurations for compact device wireless communication. While explained in terms of a laptop computer as a host device, and a PCMCIA or similar PC card as the wireless communication device, it will be appreciated that the invention is not so limited, and other host devices, such as PDAs and desktop computers, and other wireless communication devices for establishing wireless communication through a cellular network or through Bluetooth™, WiFi™ and other types of wireless links and channels are also contemplated. Moreover, the principles of the invention are not restricted to communication devices that are designed to mate with host devices to provide wireless capability thereto, but are more generally applicable to cellular telephones, two-way radios, and other self-contained wireless communication devices that may be equipped with their own antennas or antenna systems.

Those of ordinary skill in the art will realize that the following detailed description is illustrative only and is not intended to be in any way limiting. Other embodiments will readily suggest themselves to such skilled persons having the benefit of this disclosure. Reference will now be made in detail to implementations as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 22:
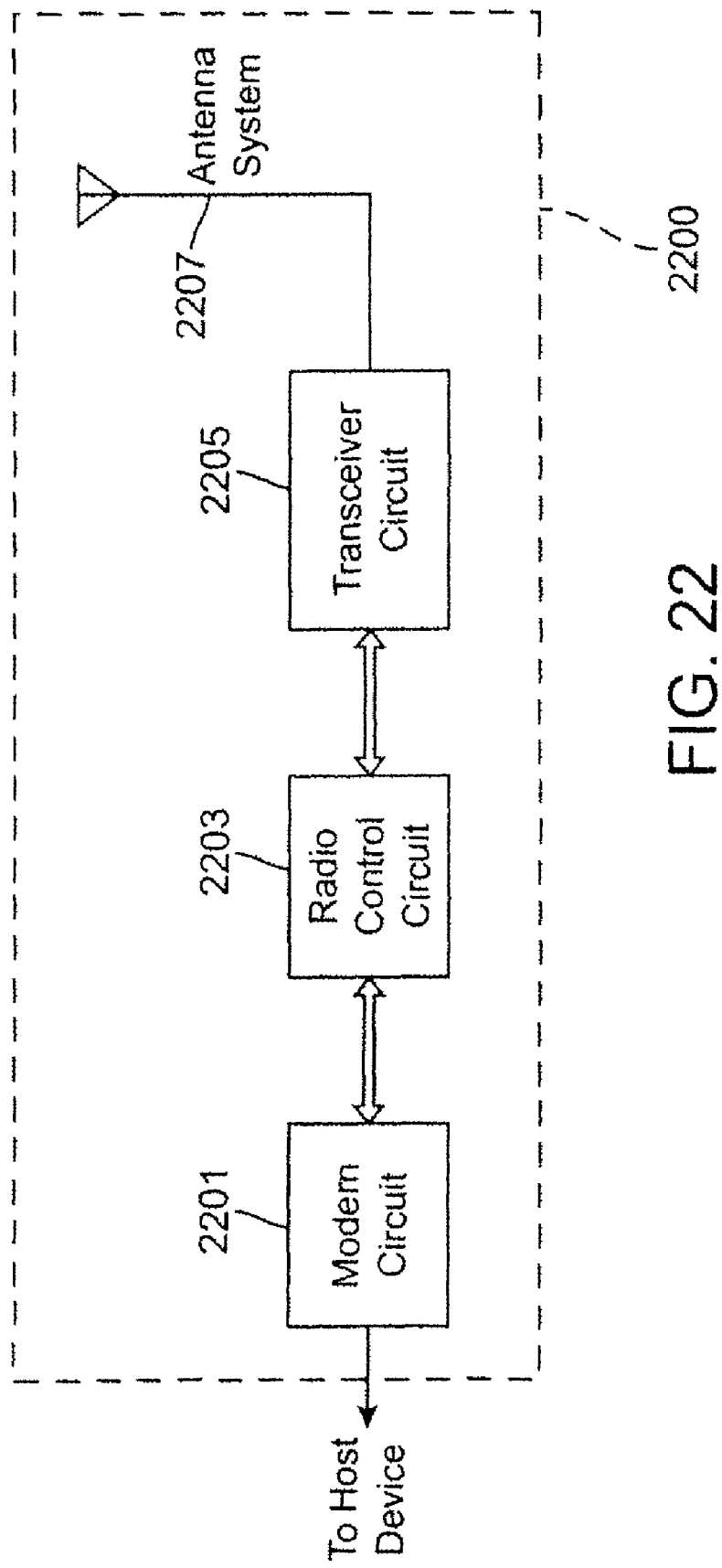

With reference to FIG. 22, a block diagram of a wireless communication device 200 such as a PCMCIA card or other PC card is shown. As explained herein, wireless communication device 2200 can be mated with a host device, such as a laptop computer or the like, to provide wireless communication capability thereto. The basic components of wireless communication device 2200, whose functions are well known and do not warrant a detailed explanation here, include a modem circuit 2201, a radio control circuit 2203 and a transceiver circuit 2205. Generally, radio control circuit 2203 can be in the form of a processor or the like and serves functions such as control of various components and their interactions, decoding of speech signals, and so on. The transceiver circuit 2205 may serve functions such as a multiplexing/demultiplexing signals to and from antenna system 2207. Modem circuit 2201 may be responsible for functions such as coding/decoding of data and transmitting same to or from the host device. Also included in wireless communication device 2200 is an antenna or antenna system 2207, whose function is to receive and/or transmit wireless signals over one or several RF frequency bands. The antenna system 2207 can have any of multitude configurations, depending on the application, as detailed below.

In the case of a diversity antenna system using two antennas, improved orthogonality between the diversity antennas can be achieved by using two orthogonal symmetrical and/or balanced antennas. FIGS. 2a-2c show three sets of balanced symmetrical antenna systems that are orthogonal. These are antenna system 21 comprising a balanced dipole with a top loaded normal monopole (FIG. 2a), antenna system 23 comprising a balanced dipole with differential and common mode feeds (FIG. 2b), and antenna system 25 comprising dual orthogonal notched antennas (FIG. 2c). In the first two cases (21 and 23), the main antenna is a balanced dipole 24 excited through a symmetrical balun 26. A balun (balance-unbalance) is a device designed to convert between balanced and unbalanced electrical signals, such as between coaxial cable and ladder line. Baluns can be considered as simple forms of transmission line transformers. In the third case (25), a symmetrical and balanced notch antenna 30 is used as the main antenna. In all three cases the main antenna extends in a direction parallel to the top face 18 and parallel to the side face 19 of the laptop host device 27 from which the PCMCIA (personal computer memory card international association) card extends.

It will be appreciated that in antenna systems the division of a receiving structure into "antenna" and "feeder" is to some extent arbitrary. Typically, the feeder conveys received power from the structure to the receiver component. If this is performed by means of a transmission line, possibly twin balanced feeder lines or coaxial cable, or by means of waveguide, the metal of the feeder structure must pass through the near field region of the antenna proper, thus modifying the antenna currents and hence the properties of the otherwise isolated antenna. In a balanced antenna receiving structure formed from dipoles or collections of dipoles, the instantaneous voltages on the two arms of the dipole can be resolved into two types of modes, differential (odd) and common (even) with respect to the dipole center of symmetry and to objects at large distances. The radiation properties of the antenna elements when fed in common mode will be quite different from those when fed in differential mode. If such an antenna is fed from an unbalanced feeder (coaxial cable, for instance) then there will be a mixture of these modes excited depending on how the feed is connected to the antenna structure. Objects in the near field of the antenna, which do not preserve the symmetry of the antenna structure, may also unbalance the antenna and give rise to coupling between the odd and even modes and will therefore distort the antenna pattern and balance.

An important example of the effects of unbalance in radiating systems may be seen in the PC card form factor wireless device plugged into a laptop computer platform, which typically consists of a metal frame surrounded by a plastic shell. In this situation, the laptop computer platform takes the place of a ground plane to a large extent. The antenna is therefore primarily a monopole in relation to this "ground plane". However, there will be currents flowing on the laptop computer surfaces (in particular, the metallic surfaces inside the laptop), which will contribute to the radiation properties. There is usually only capacitive coupling from the antenna(s) of the wireless device antenna to the laptop, and indeed, the laptop may be placed on an insulating dielectric surface (wood table for example), in which case the antenna elements may be balanced by the equivalent length of the case containing conducting material. In this case the radiating structure looks more like a dipole. In a typical antenna installation, the receiving element is a balanced dipole. Very often the feed is an "unbalanced" coaxial cable; reflections at the feed-dipole junction will give rise to currents flowing along the outside of the coaxial cable braid. This contributes to the radiation, and the polarization sensitivity may be altered from the orientation of the dipole elements. It also affects the radiation pattern and the positions of the nulls. The problem can be addressed with the provision of a balun (balance to unbalance transformer).

Returning to FIGS. 2a-2c, the diversity antenna 31 consisting of elements 32 and 34 shown in FIG. 2a is center fed from the ground plane directly below using the common mode feed 36. Since this top loaded diversity antenna 31 is common mode fed, the currents flow down the two arms (32 and 34) in an opposite sense in the direction horizontal and parallel to the computer case. This results in zero effective current flowing in this direction due to the feed used. Thus there can be no coupling between the main dipole antenna 24 and the common mode feed point 36 so long as the symmetry is maintained. There is, however a net current flowing in the two arms 32 and 34 in the direction normal to the computer laptop case. This current does flow into the common mode feed system 36 and uses the computer case as its counterpoise. The result is a top loaded monopole normal to the computer case face at this point. It should be noted that there will be coupling between the main antenna 24 and the odd mode in the diversity antenna top loading that is parallel to the computer case. As will be described below, this may be used to enhance the antenna performance in the main antenna, although it can also be a source of significant loss.

A "mode" on an antenna describes the electric current and potential distribution on the antenna conductors. Modes are decomposed into orthogonal even and odd symmetry. An even mode will have an even integer number of effective half wavelengths including 0. An odd mode will have an odd integer number of half wavelengths. Typically in a center fed dipole antenna, the current will flow in the same direction in the feed line at the feed point for an even mode and in the opposite direction for an odd mode.

In FIG. 2b, the second diversity antenna 38 uses the common mode of the main antenna 24 and a double balun 40 connected to the ground plane to achieve a non-balanced dipole. This dipole is orthogonal to the main dipole and therefore achieves high isolation.

The last example of FIG. 2c—antenna system 25 comprising dual orthogonal notched antennas—shows two balanced notches 41, 42 cut into the notch ground plane 44. These two notches can be combined using a gap feed and a Wilkinson power splitter combiner or similar device to combine the notch signals in phase and thereby produce an effective horizontal dipole normal to the computer case face. Such a system will be highly isolated from the main antenna 30. In FIG. 2c, it can be seen that Nd1 and Nd2 combine to reject Nm and to enhance response in the Ey direction.

Figure 3A:
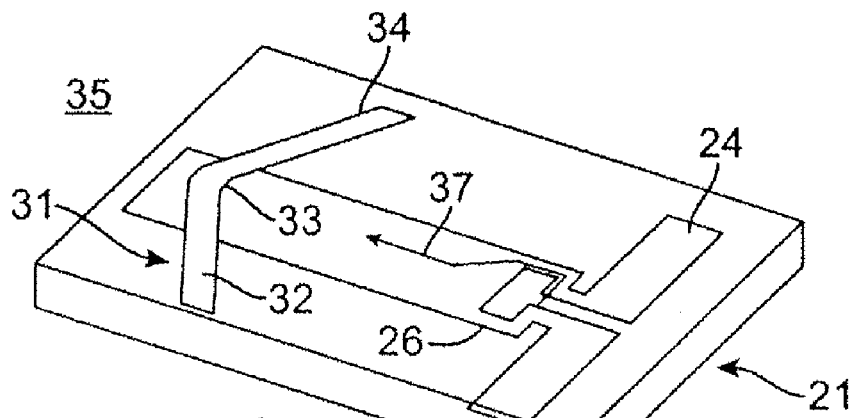
FIGS. 3a-3d show various diversity antenna configurations.
Figure 3B:
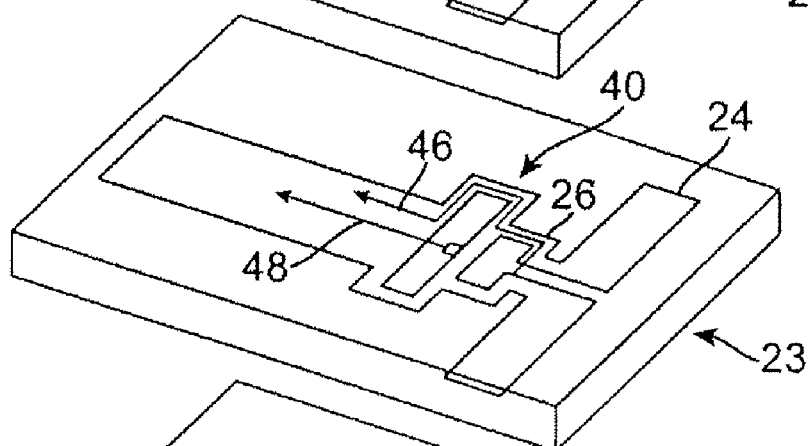
Figure 3C:
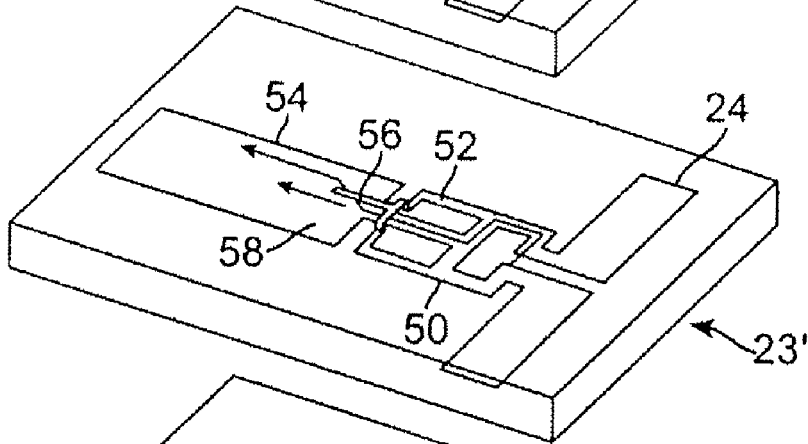
Figure 3D:
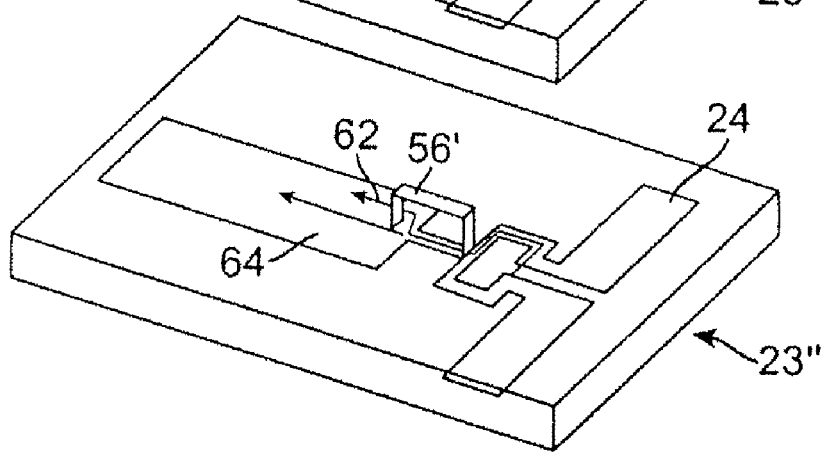

FIGS. 3a-3d show further details of the diversity options and some additional options as well. FIG. 3a is a more detailed view of antenna system 21 comprising a balanced dipole with a top loaded normal monopole as in FIG. 2a. The diversity antenna 31 is fed from port 33 and uses the computer case 35 as its counterpoise. The main feed 37 excites the gap of balun 26 that is connected to the balanced dipole antenna 24. FIG. 3b shows an antenna system 23 comprising a balanced dipole with differential common feeds as In FIG. 2b, but in greater detail. Note the two independent feed systems 46 and 48 for the main and diversity antennas, respectively. FIG. 3c shows an antenna system 23' using a bridged version for the balanced balun of FIG. 3b. The main feed system travels along the balun 50 through the center portion of the dual feed system 52 to the main feed line 54. A metal jumper 56 connects the dual feed system 52 to the diversity antenna feed 58. FIG. 3d is an antenna system 23" which is a simplified version of antenna system 23' of arrangement C and uses a jumper 56' as a balun to excite the common mode of antenna 24 with the ground plane connected to the computer case. The main 62 and diversity 64 feeds are also shown in this sketch. A further variation can be realized if the arrangements of FIGS. 3b, 3c and 3d are designed such that the common mode of the main dipole acts as the counterpoise for the diversity antenna when the stem to the left becomes the other side to this second dipole. This stem may be isolated through a "feed style trap" from the case of the main module or modem. This trap would be a coaxial or stripline or equivalent feed that uses the outside surface as an RF trap either as a distributed quarter wavelength shunt or shortened using capacitive loading on a shorter length shunt (hairpin style trap). This would still maintain symmetry with the main dipole, thus allowing for excellent cross-polarization isolation. Additionally this second dipole (in place of the diversity monopole) could be made symmetrical and balanced with respect to itself as well by adding two arms symmetrical with the common mode arms of the main dipole. If there is sufficient clearance below the two dipoles, the two dipoles can be fully crossed in an orthogonal manner, allowing for perfect symmetry in both horizontal axes. In this latter case the new system could be rotated by any angle in the horizontal to best fit the available geometry. One such rotation would be 45 degrees. Clearly, two symmetrically crossed dipoles do not require the other for counterpoise purposes.

Figure 4A:
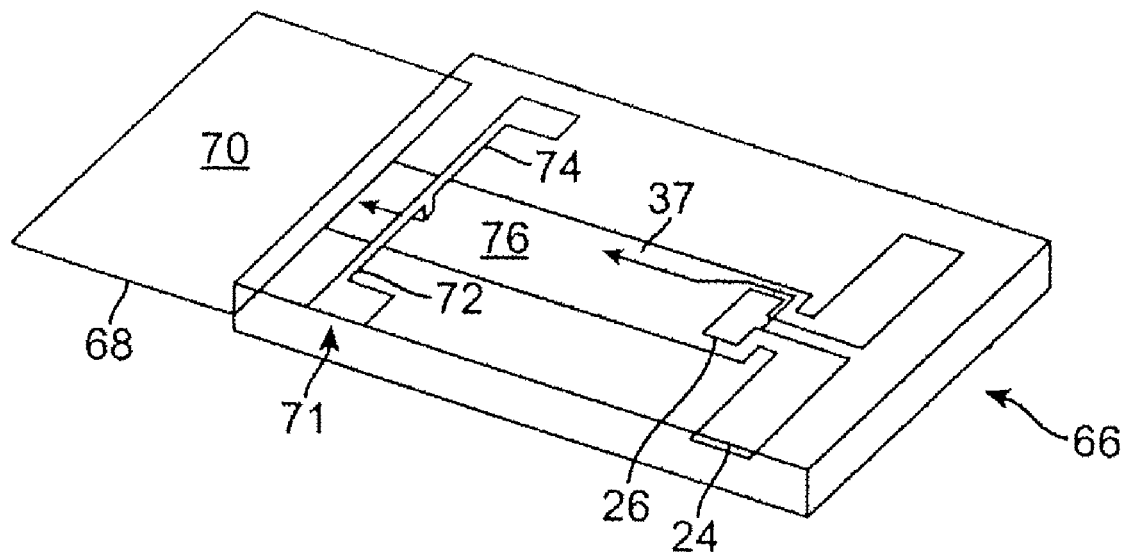
FIG. 4a shows a high isolation diversity antenna.

As previously explained, antenna system 21 comprising a balanced dipole with a top loaded normal monopole of arrangement of FIG. 3a is fed from port 33 and can use the computer case as its counterpoise. The main feed 37 excites the gap of balun 26 that is connected to the balanced dipole antenna 24. An alternative realization of such a high isolation diversity antenna system 66 is described with reference to FIGS. 4a-4c. In FIG. 4a, the effective ground plane 68 of the PCMCIA card case (fabricated from metal) and the computer case 70 are also shown. The main antenna shares components 24, 26 and 37 with the main antenna of antenna system 21. The diversity antenna 71 includes L-shaped arms 72 and 74. Although shaped differently from diversity antenna 31 of antenna system 21, diversity antenna 71 is essentially functionally the same. The common mode feed system is port 76.

Figure 4B:
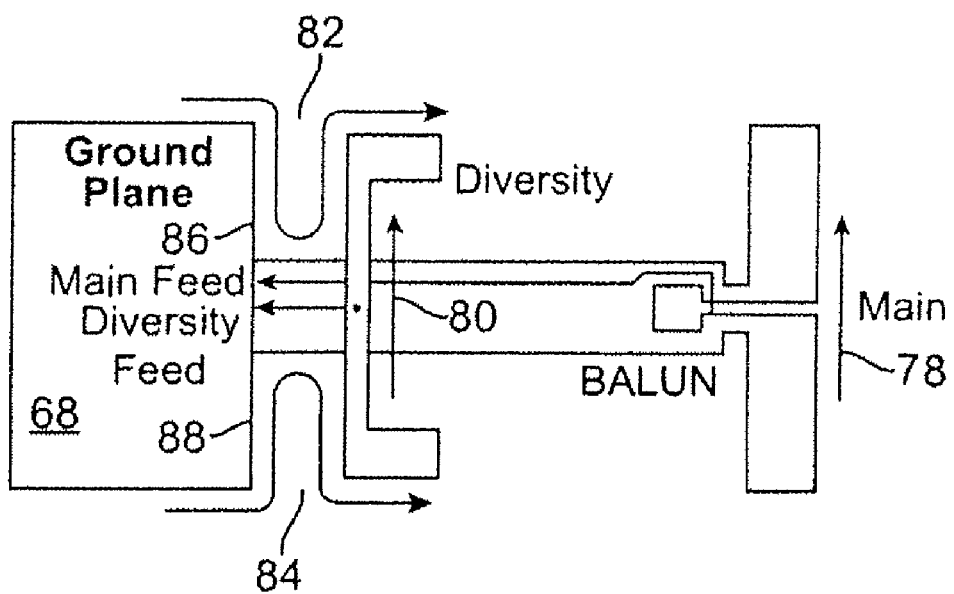

FIG. 4b shows the magnetic potential flow of the antenna system 66, associated with the current flow, at both the main and diversity antennas. The magnetic potentials 78, 80 show the same direction and therefore will mutually couple in the direction of the magnetic potential 80. The effective magnetic potentials 82, 84 cancel out, but reinforce in the direction normal to the magnetic potential 80. The main 86 and diversity 88 feed systems connect to the RF circuit (not shown) located in and on the ground plane 68. The isolation for this arrangement has been found to be better than 30 dB. With improved symmetry, it may be possible to improve this isolation even further, although already it is more than sufficient for the intended application.

It will be appreciated that FIGS. 4a and 4b relate to a top-loaded monopole (71) style of antenna, but it should be noted that it is a very useful improvement to split the monopole and in particular the top loading section into a left and right section about the axis of symmetry into two distinct components that can be separately fed in phase and combined through a power combiner. This separation gap may be significant but typically not exceeding one tenth of a wavelength in most cases. A discussion of such an arrangement appears below.

Figure 4C:
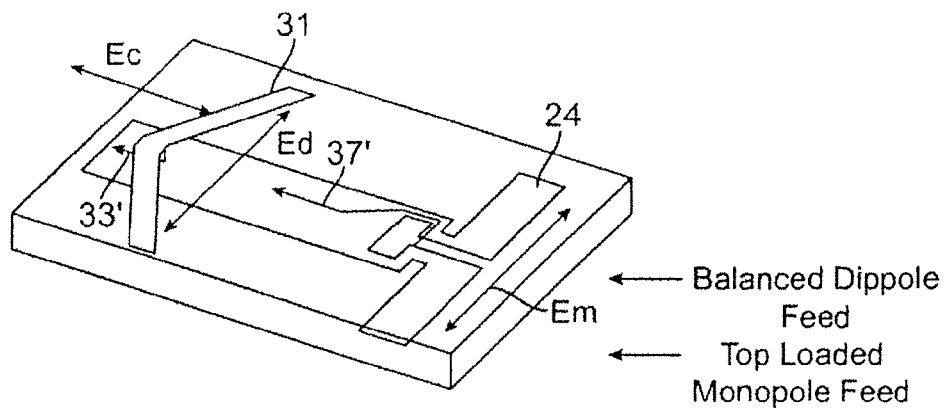
FIG. 4c is another view of the diversity antenna of FIG. 3a, showing in addition the polarization directions involved.

Another aspect relates to the use of a high isolation diversity antenna with an orthogonal main balanced dipole. As previously explained, for the antenna systems 21 and 66, there are two basic "high isolation antennas" each consisting of a main antenna (24) and a diversity antenna (31, 71). The main antenna 24 is the same in both cases and uses a balun feed to excite the dipole. The diversity antennas 31 and 71 are fed in the common mode with ports 33 and 76, respectively. With reference to FIG. 4c, it is shown that orthogonality results from the orthogonal polarization $E_m$ of the main antenna 24 being orthogonal to the common mode of the diversity antenna 31,71 having a polarization $E_c$. This arrangement is basically a monopole that uses the effective ground plane of the computer case and the ground plane of the PCMCIA card as its counterpoise. For reference purpose the feeds 37' and 33' for the main (24) and diversity (31) antennas, respectively, are also shown.

The excitation of the odd mode in the top loading of the diversity antennas 31, 71 due to the main antenna 24 should also be considered. While this odd mode does not couple into the common mode (also known as the even mode) of the diversity antenna, it does mutually couple with the main dipole antenna. This is the case with other forms of antennas such as a slot, notch or patch antennas. The result of the mutual coupling is a modification of the impedance of the main antenna, and this may have either a beneficial or deleterious effect on the match and/or bandwidth, depending on the circumstances.

Figure 5A:
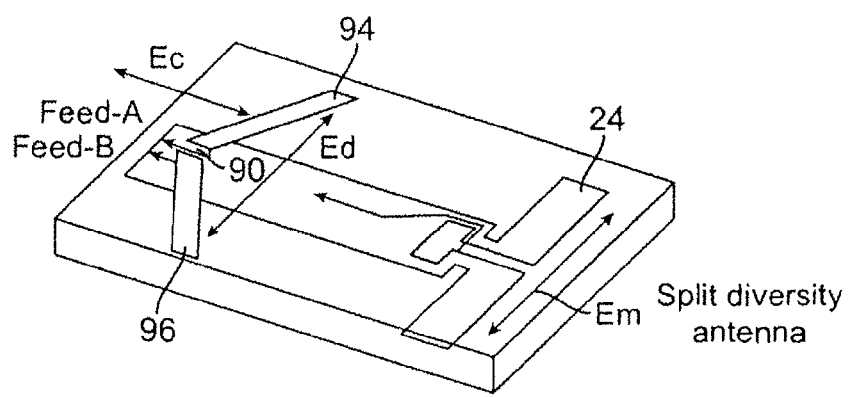
FIGS. 5a and 5b show two configurations of split diversity antennas.
Figure 5B:
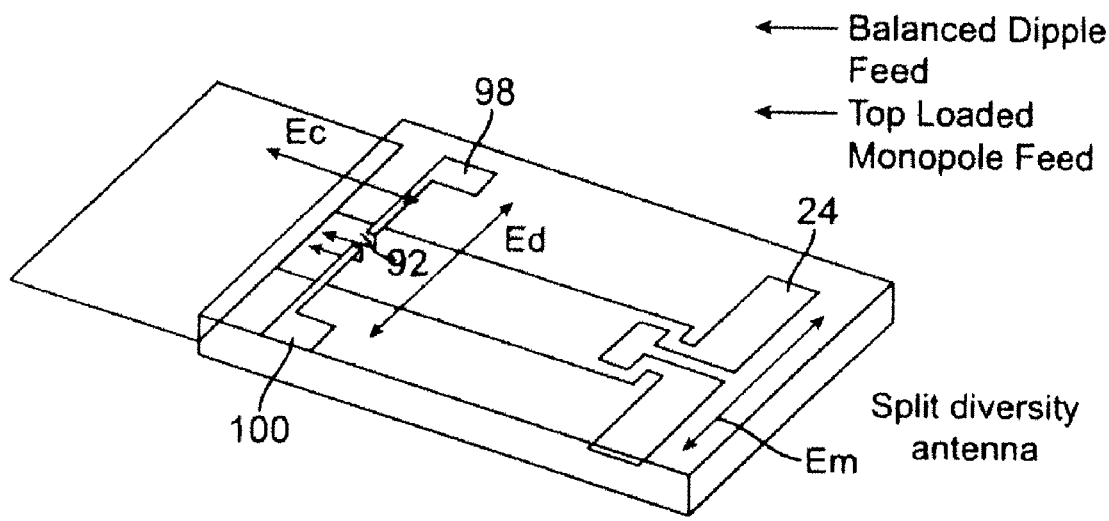

The odd mode excitation can be modified by breaking the diversity antennas at their center, creating finite gaps 90, 92, between separate arms 94, 96 and 98, 100, as seen in FIGS. 5a and 5b. The gaps can be from small to substantial in reference to a quarter of a wavelength. Regardless if the symmetry is maintained, so will the isolation be maintained. With the diversity antenna thus open circuited, there can be no odd mode excitation Ed due to the main dipole antenna 24. However, the simple cut also defeats the common mode excitation. The remedy is to use a wide band in-phase Wilkinson style power splitter 102, shown in FIG. 6a, to drive the split arms 94, 96 and 98, 100 via Feed-A and Feed-B. The Wilkinson power splitter 102 splits the input signal into two equal-phase output signals. Such a device will produce, at its output, the common/even mode of the diversity antenna, while isolating the odd mode by providing high isolation between the two arms in the differential, or odd, mode. Alternatively or additionally, a matching circuit can be used across the gap to promote the match and bandwidth of the main dipole antenna whilst still maintaining the high isolation. A very simple reduction of a Wilkinson splitter, designated 104 in FIG. 6b, can also be realized using discrete components as shown. This network is useful in narrow band applications; however, it will be appreciated that more complex splitters, distributed and discrete, can be used provide for wide bandwidths.

Figure 6A:
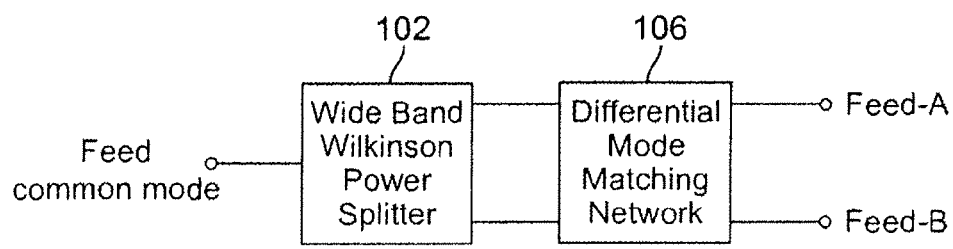
FIG. 6a is a schematic diagram showing the use of a power splitter.
Figure 6B:
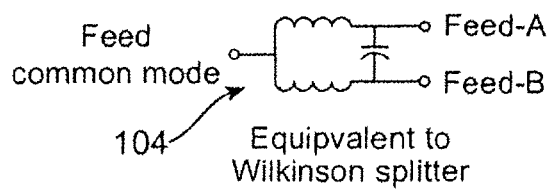
FIG. 6b is a schematic diagram illustrating a circuit equivalent of a Wilkinson power splitter.

In cases where the odd mode coupling has a negative effect on the main antenna, the splitter method can correct this. However, it is often possible to use the mutual odd mode coupling in a way that provides improved broad banding of the main antenna. As seen in FIG. 6a, a matching section 106 has been added between the Feed-A and Feed-B. In this case the matching section 106, so long as it maintains a high impedance in the common mode to ground, does not change the common mode match at the output. Thus a network can be designed either discrete, distributed or both that optimizes the reactance in the odd mode that achieves maximum bandwidth due to the mutual coupling.

Figure 6C:
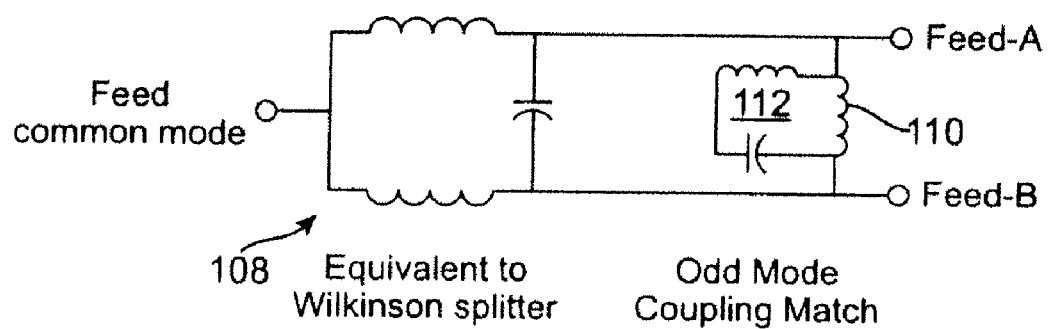
FIG. 6c is a schematic diagram showing a splitter with odd mode matching that provides optimum matching for a dual band application.

A schematic for the above diversity/main antenna system is shown in FIG. 6c using a splitter 108 with odd mode matching that provides optimum matching for a dual band application operating in two bands over one octave apart in center frequency. The best main antenna bandwidth may be achieved for the high band when the resonator is slightly capacitive in reactance and the inductor 110 in combination with the dominant capacitance of the series resonator 112 at the low band produced the desired optimum performance in the main antenna when the combination (110, 112) was of high impedance in the low band. Clearly the choice of the match is a function of the ground plane, the location of the diversity antenna, and the location of the main antenna and the targeted band. Other configurations are possible and can be tuned using modeling tools and/or a vector network analyzer. In an application in the band 1.9 GHz, the usable bandwidth was almost doubled by the proper selection of components, including the selection of a low inductance feed line in the two arms 94, 96 and 98, 100 of the diversity antenna.

Previous PCMCIA card products have demonstrated poor isolation between the main antenna and the diversity antenna and also poor isolation of the main antenna from unwanted noise generated in the host lap top computer which are well known for high radiated self noise particularly as processor speeds are increasing and contaminating the wireless spectrum in the proximity of the slots for PCMCIA cards. This is further impacted by the lack of tight RF shielding in typical laptops where the requirement is to meet FCC part 15 requirements and little attention is given to self noise issues outside of these FCC limits. An external scan of a typical laptop will show maximum radiated noise in the vertical polarization with respect to the keyboard plane and also in any conducted path between the antenna and the laptop case. The most quiet zone for a dipole is easily observed when the antenna length axis is parallel to the side of the laptop.

Typically whip antennas and PIFA antennas, that are notoriously unbalanced, have been used in the past for the main and diversity applications with generally troublesome results in performance and, in particular, isolation, due mostly to the conducted noise mentioned above.

To address these and other problems, use can be made of a symmetrical balanced dipole parallel to the host computer face containing the PCMCIA card slots, an orthogonal diversity antenna with optimized mutual odd mode coupling, inductive coupling to simplify and cost reduce main antenna connection to the main ground plane, and a centrally and symmetrically located upward pointing RF switch connector. The limited dipole length particularly impacts the lowest frequency band, in this case the cellular band. Top loading of the low band element of the dipole brings the antenna back to resonance and provides for improved bandwidth. The high band—namely the PCS band—is already of ideal length so the same extent of top loading is not required and a bowtie dipole can be implemented.

To reduce SAR (specific absorption rate), the dipole can be raised at its center in the vertical direction since the SAR is related substantially to the magnetic field generated by the RF current maximum at the dipole center. SAR is a measure of the amount of radio frequency energy (radiation) absorbed by the body when using a radio transmitter device such as a cell phone, PCMCIA card, and the like. Increasing distance will reduce the SAR in accordance with the inverse square law. In addition, the dipole width can be maximized, which further distributes the current, causing the magnetic field to spread further, thereby significantly reducing SAR. Further, since the current is low in the top loaded region of the low band dipole, this can be folded down towards the ground where there is likely SAR impacted tissue without increasing SAR yet allowing decreased dipole resonance and bandwidth in a compact volume.

Figure 7A:
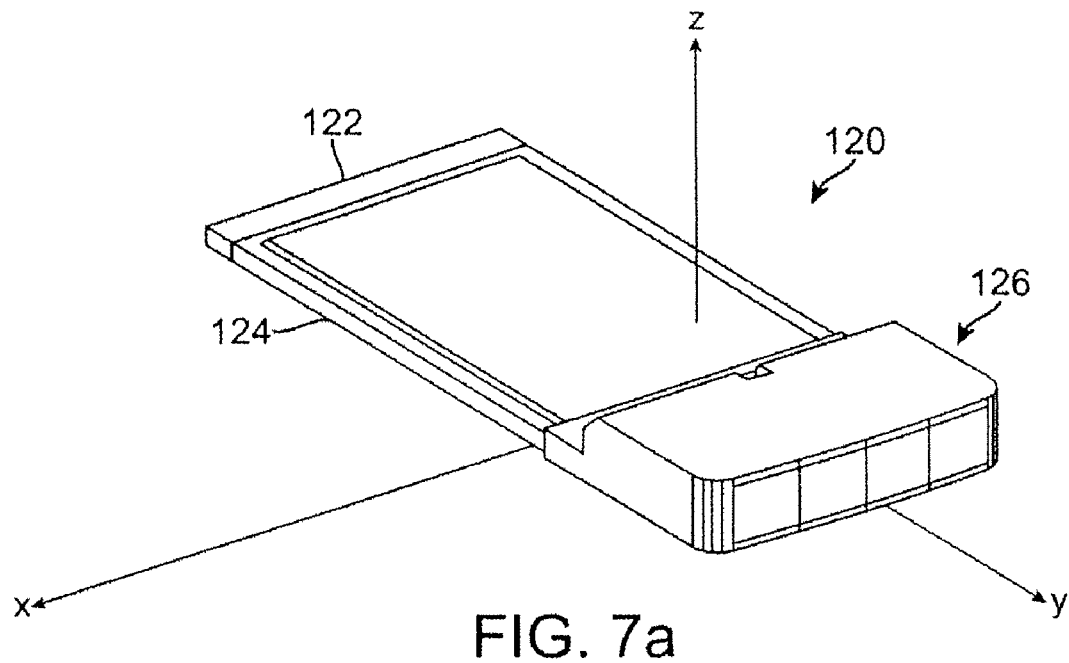
FIGS. 7a-7b show a PCMCIA card including a diversity antenna.
Figure 7B:
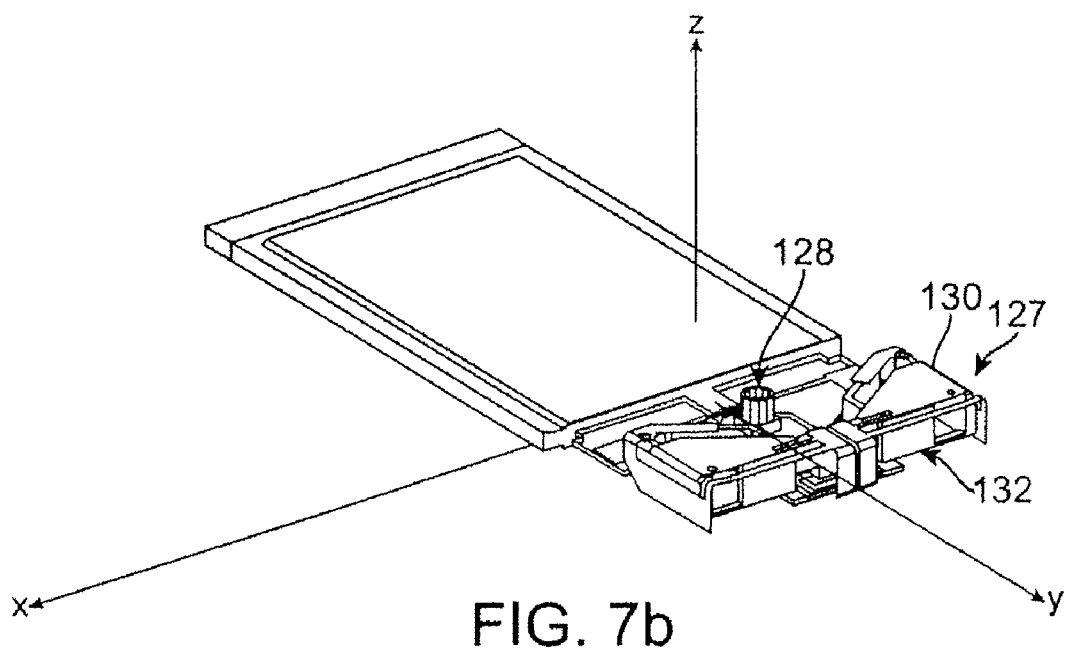

FIG. 7a shows a PCMCIA card 120 having a card connector 122, a case 124 and an antenna section 126 having a dielectric cover. FIG. 7b is a view showing the antenna assembly 127 with the dielectric cover removed from the antenna section 126. An RF connector 128 disposed centrally and oriented in an upward direction can be seen, along with a flexible antenna FPCB (flexible printed circuit board) 130 having an antenna support shown generally at 132 for supporting the FPCB. FPCB 130 is folded to assume a substantially three-dimensional shape for the antenna.

Figure 8A:
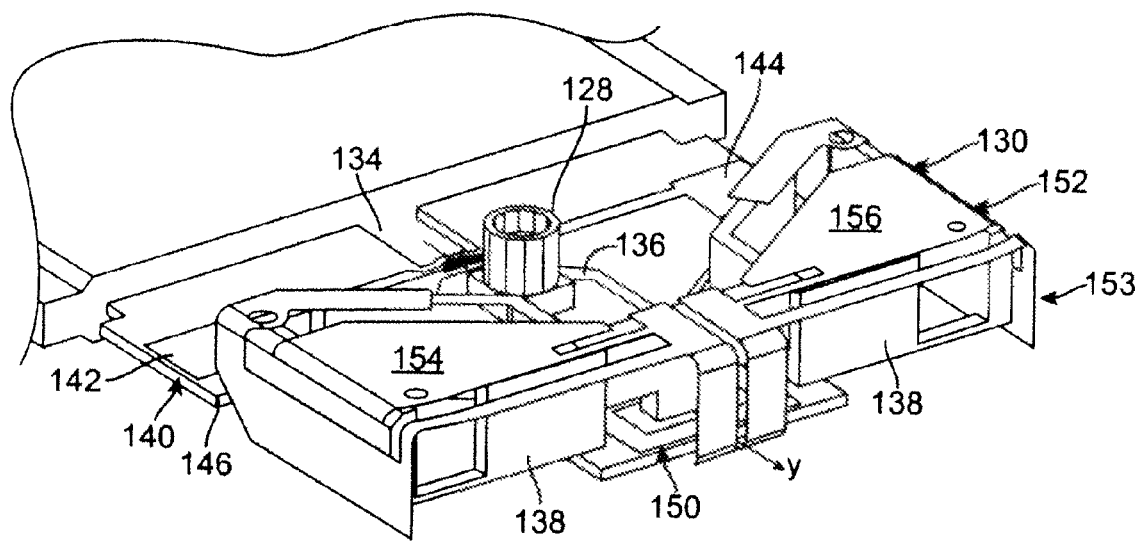
Figure 8B:
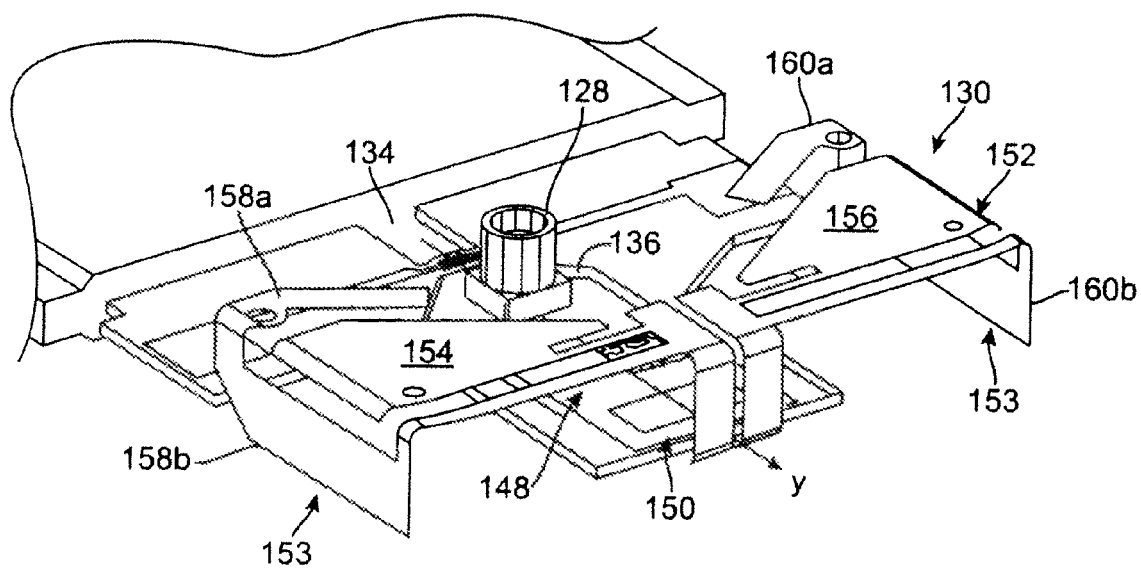

FIGS. 8a-8b show the details of the antenna assembly 127. A main antenna ground plane 136 connects to the card ground plane 134 including the case and, in turn, this connects to the host ground plane through the PCMCIA interface connector 122 (FIG. 7a). The FPCB antenna 130 is shown supported by the plastic antenna carrier or support 138, which is part of the antenna support 132 (FIG. 7b). The wings 142, 144 of the top loaded diversity antenna 140 are disposed on the main PCB (Printed Circuit Board) 146 and connect to the diversity feed system (not shown) behind the main RF connector 128. An inductive coupling mechanism 150, described in more detail below, couples the main antenna FPCB 130 to balun loop 148 formed in the ground plane 134. This connection provides for a connector-less, solder-less coupling between the main antenna and the balun 148.

Figure 9A:
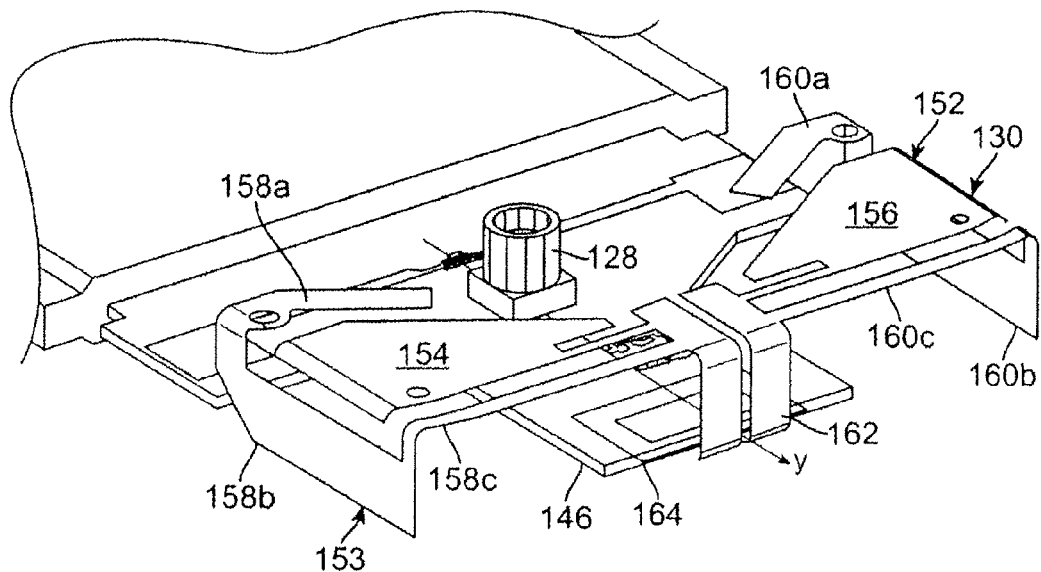
Figure 9B:
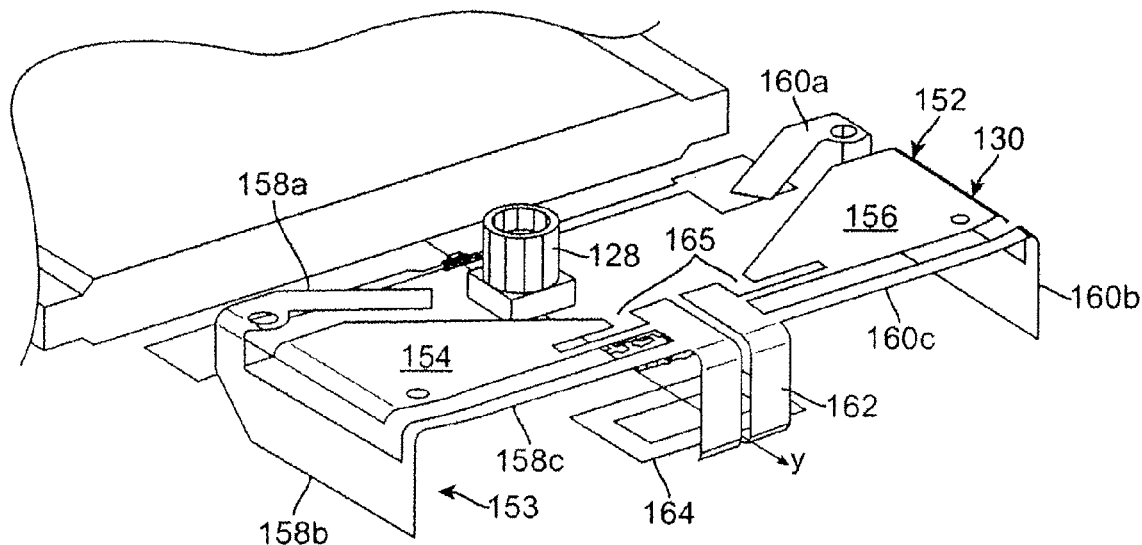

As seen from FIGS. 9a and 9b, the main antenna FPCB 130 includes a high band bowtie-style dipole antenna 152 having wings 154, 156 and a low band top-loaded dipole antenna 153 including portions 158a-b, 160a-b. Respective feed arms 158c, 160c are provided for low band top-loaded dipole antenna 153. A main antenna feed 162 is also provided, as is an inductive coupling loop 164 disposed on the underside of PCB 146. Of particular note is the alignment of the dipole length axes relative to the host computer/laptop, and in particular, in parallel relation to the side of the laptop case into which the PCMICA card is inserted. Of further note is the deliberate height or elevation of the central part of at least one of, and in this case both, the dipoles 152, 153, so conFIG.d to minimize SAR. The elevation is of the central part of the dipoles is relative to the bottom of the card 120 (FIG. 7a), which bottom may be closest to the user when the PCMCIA card is plugged into the laptop the laptop is placed on the user's lap. The elevation thus increases the distance from the user and reduces SAR to the user.

Low band tuning (of antenna 153) is achieved by adjusting the tabs 158a, 160a. The tuning of the high band bow-tie antenna 152 is determined by the notches 165 in the pattern near the feed 162. Thus FPCB 130 operates as a dual-band symmetrical center fed dipole fed from an inductively coupled loop balun. The main RF connector 128 is also shown with the diversity antenna 140 located behind it.

Figure 10A:
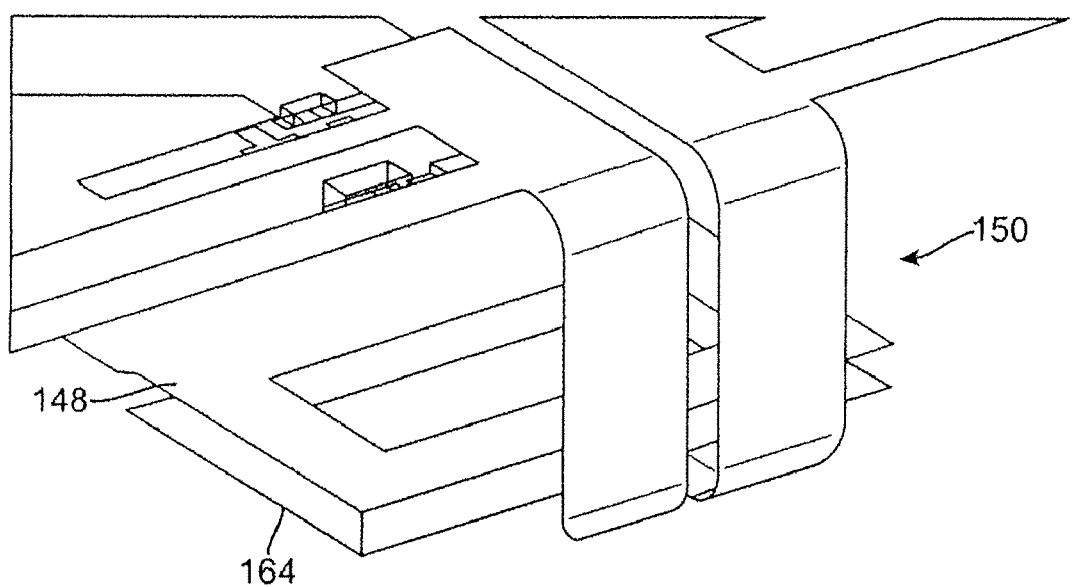
FIGS. 10a-10b show details of an inductive coupling scheme.
Figure 10B:
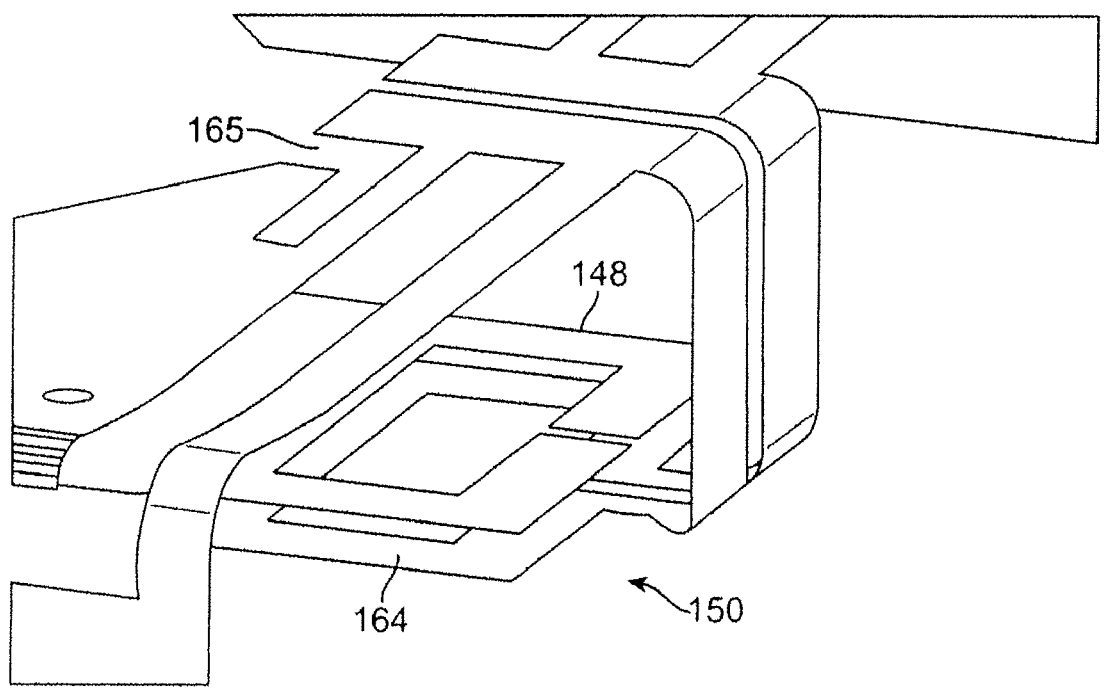

FIGS. 10a and 10b show more detail of the coupling mechanism 150, which includes coupling loop 164 for FPCB main antenna 130 in confronting relationship with main ground plane balun loop 148. Main ground plane balun loop 148 can be printed on both sides of the main PCB thus providing for strip line coupling to the gap in the main loop. The stripline then connects to the matching circuit 166, shown in FIGS. 11a and 11b, on the main PCB. If the loop is only on a single side of the main PCB then a microstrip coupling is used. This in turn connects with the matching circuit 166.

Figure 11A:
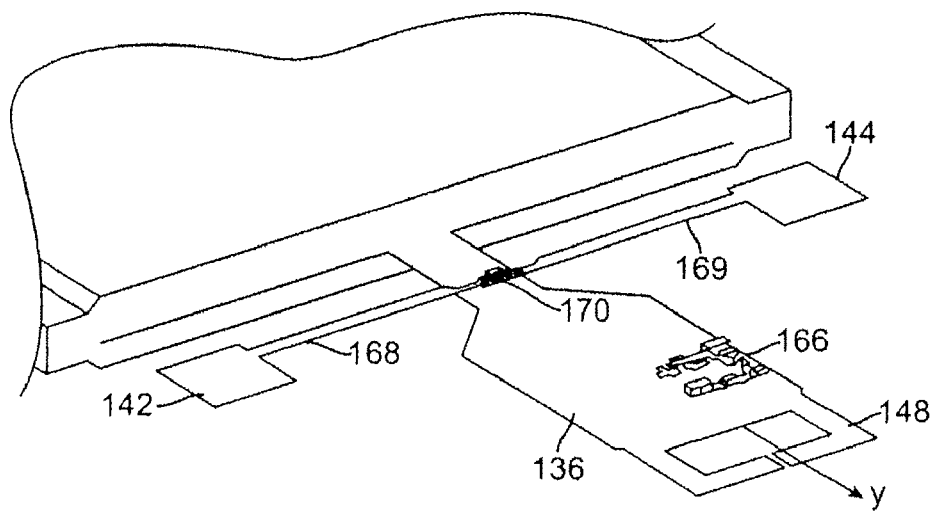
FIGS. 11a-11b show details of an antenna assembly including details of the diversity antenna and circuit components associated therewith.
Figure 11B:
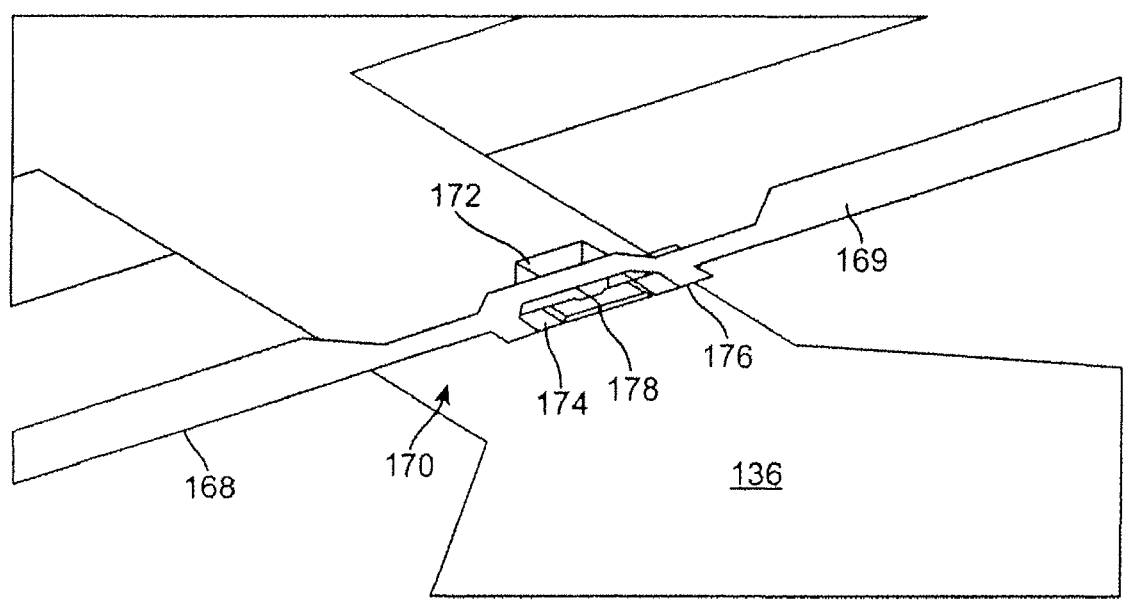

FIGS. 11a and 11b show more details of the diversity antenna 140, which has feeds 168 and 170 for arms 142, 144, respectively. The width of the feeds 168, 170 determines the series inductance of the diversity antenna and has a significant impact on the main antenna match in the PCS high band. A power divider and odd mode matching section is shown generally as the cluster of components 170 comprising a shunt capacitor 172, two series inductors 174, 176 joined to the common mode feed system at node 178. The ground plane 136 for the main antenna system is shown with the balun coupling loop 148 and matching components 166 for the main antenna match. These matching components are connected to the loop coupling gap by either stripline or microstrip line.

It is possible to effect some modifications to the main antenna FPCB feed arms, making them wider in order to allow for lower Specific Absorption Rate (SAR) due to the spreading of the radiating power over a larger FPCB area, particularly in the feed arm region.

The consideration of optimum dipole location for minimum laptop self-noise is discussed with reference to FIGS. 12d-12f. The optimum polarization for the PCMCIA card antenna in a laptop has been found to be in a direction parallel to the long edge of the slot opening 1202 and E field Ex illustrated in FIG. 12d. In particular, position 1203 depicted in FIG. 12d provides an improvement in noise rejection by at least 10 dB in all bands. This is due to the polarization and the balance of the antenna. Therefore, to couple to the least noise from the laptop chassis, one solution is to use a balanced antenna with its polarization in the Ex direction 1203.

There are several candidate antennas that will provide this solution. The first, seen in FIG. 12d, is a dipole 1210 that is center-fed. Antenna 1210 is kept balanced with a balun feed system 1211; however, it will be appreciated that any differential feed system can be used. The second candidate is the antenna in 1212 in FIG. 12e. Antenna 1212 is a notch antenna that may be fed across the notch at a location that best serves the desired matching impedance. In a sense this is also a type of balun-feed, as in FIG. 12d. Modifications to the notch can be used to provide traps and other such devices to lower the center frequency and to improve the bandwidth and match of this antenna. In principle, the notch and balun-fed dipole antenna can morph into one another as necessary.

The third candidate is a slot antenna 1213, shown in FIG. 12f. This antenna can also be modified as necessary to improve bandwidth match and lower center frequency without departure from the spirit and scope of the invention. An important advantage of this configuration is minimization of laptop-generated noise coupling into the antenna structure.

The consideration of optimum dipole location and shape for maximum bandwidth in a small volume is explained with reference to FIGS. 13a-13c and 14a-14b. With short dipoles (often referred to as Hertzian dipoles), the current distribution from the center of the dipole to the tip decreases linearly to zero. This results in a very short region where the radiation-inducing current is effective. With a standard dipole, the roll-off is a cosine form, which results in a much wider region over which the radiation-inducing current is effective, together with the fact that the antenna is longer anyway. This radiation current is the substantial generator of the far-field magnetic field component. For a dipole, the longer the radiation current region is, the higher the effective radiation impedance will be. As it turns out, this radiation current region will be reduced as a reflector approaches the antenna starting at 0.25λ, thus ultimately shorting out the antenna at zero distance, with λ being the wavelength of the interest. It is therefore important to locate the radiation current region as close as possible to 0.25λ from a reflector for the best results. While the use of one or more directors in the front of the dipole would help the back-to-front ratio, this also impacts the overall length of the antenna and therefore would most likely violate the industrial design constraints.

FIGS. 13a-13c respectively show three balanced dipole or dipole-like antennas. The first antenna 1301 in FIG. 13a is a basic balun-fed dipole located within a controlled length enclosure of length Lid as measured from the side face of the laptop computer to the end of the wireless communication device, in this example a PCMCIA card plugged into the laptop computer. The dipole effective radiation current Ix is a distance La from the reflector face 1305 (that is, the side edge of the laptop case, which behaves as a reflector). For best performance, this distance La should be in the range of about 0.15λ<La<0.25λ, although a distance as short as about 0.09λ could work.

The diagrams in FIGS. 13b and 13c show a notch antenna 1307 and a top-loaded dipole antenna 1311, respectively. The effective radiation current Ix distances from the ground plane reflector are depicted as Ln and Lc, respectively. The top loading 1309 of the dipole antenna 1311 allows the effective current Ix to be more spread out than a short dipole would allow.

FIGS. 14a-14c relate to three configurations (1413, 1415 and 1417) of a top-loaded dipole in a PCMCIA card arrangement. The respective effective current Ix distances of the dipoles from the reflector face 1305 in these configurations are Lc, Lcr and Lcf. Clearly Lcf offers the greatest separation between the radiating current region and the laptop case/reflector, and still falls within the maximum industrial design length of Lid. Moreover, the longer the distance Lcf, the easier it is to achieve the required lowest frequency specification and, furthermore, as this length increases, so will the antenna bandwidth.

Figure 14D:
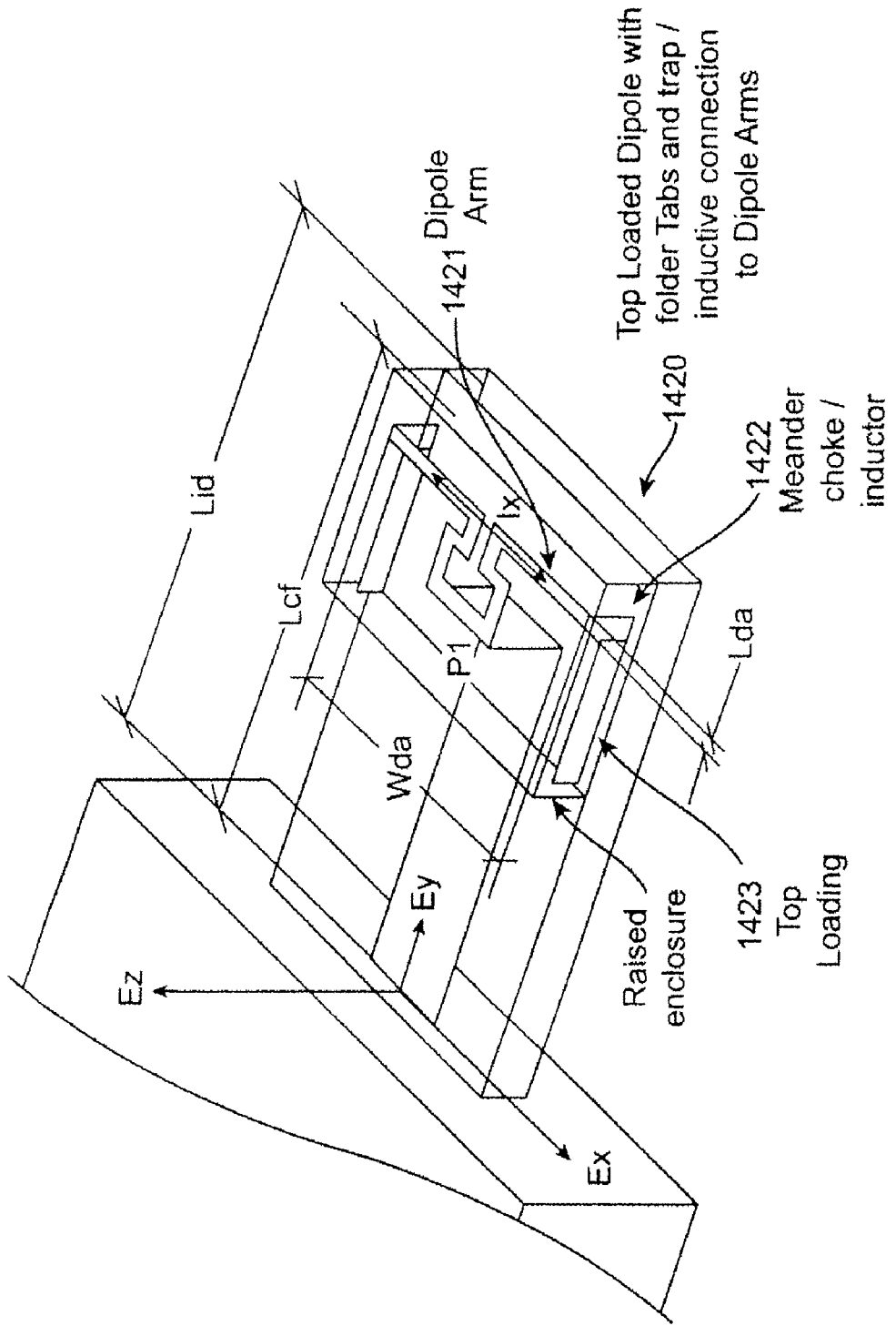

FIG. 14d shows a more detailed version of a top-loaded dipole 1420 that includes the dipole arm 1421, a meander choke/inductor 1422, and top-loading scheme 1423. The top-loading is folded over as shown to maximize the length Wda of the dipole arms 1421. Maximizing this length in particular increases antenna bandwidth. Similarly, widening the dipole arm thickness Lda in the Ey direction also increases antenna bandwidth.

For the lowest operating frequency with an aggressive industrial design length, the top-loaded dipole design 1417 (FIG. 14c) offers the optimum configuration for the best bandwidth and efficiency performance for a dipole antenna in a PCMCIA card application in a laptop computer. This dipole arm provides the greatest antenna current flows, which can be at the maximum distance away—up to about 0.25λ. Furthermore, in the interest of maximum antenna bandwidth, the antenna arm depth should also be maximized, even to 0.25 λ also, although lesser depths are often satisfactory.

In situations where additional operating bands are required, these will be clearly at higher frequencies and can therefore be included inside the lowest band top-loaded dipole which will be furthest to the front. These additional dipoles may not require top-loading and may also share a common feed system. There may be a requirement to include some trap/high inductance elements between the front dipole 1419 and its associated top-loading section to minimize loading of the higher frequency dipoles.

Figure 15D:
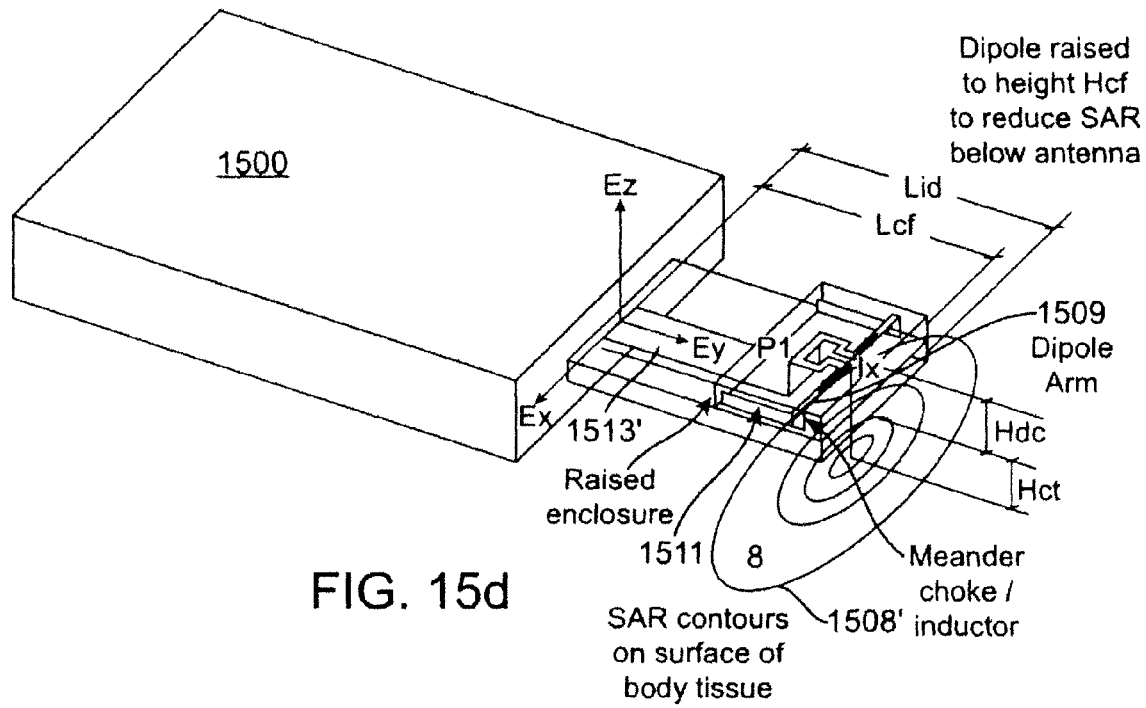
Figure 15E:
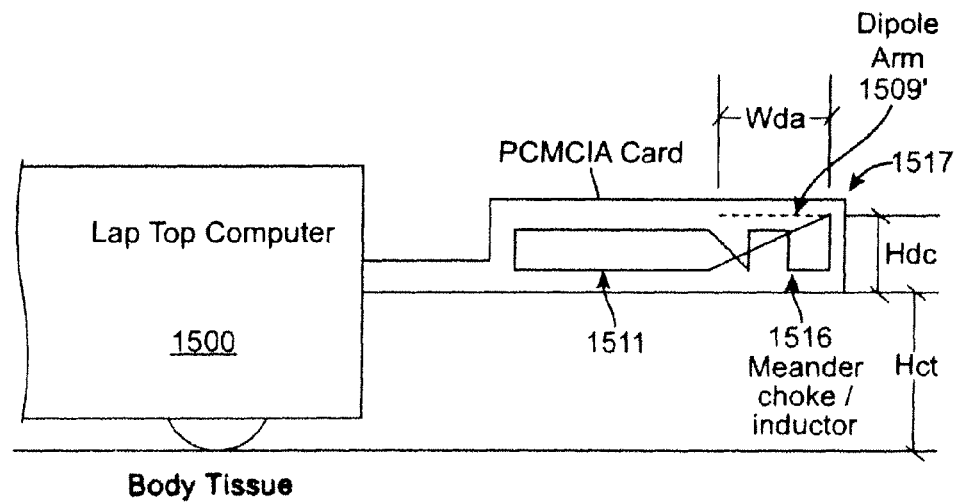

The consideration of optimum dipole location and style for minimum specific absorption rate (SAR) in a small volume, for example in cellular telephone, or a PC card such as a PCMCIA card, is discussed with reference to FIGS. 15c-15e. The separation distance between the hotspot and the tissue of the operator is the most effective SAR remedy. The SAR decreases with approximately the inverse square of the separation distance. Hence, doubling the distance will reduce the SAR by a factor of 4. In the disclosed antenna system it has been recognized that primarily the high-current portion of the antenna needs to be raised to reduce SAR. Similarly, broadening and lengthening the high current portion also reduces the SAR significantly, particularly if the antenna is thin in the region of the feed point.

In the SAR mitigation configuration described with reference to FIGS. 15c-15e, a PCMCIA card is shown plugged into the laptop computer 1500. In FIG. 15c, the dipole antenna 1506 of PCMCIA card 1520" is shown to be raised above the feed plane 1513. This rise is labeled Hdc as measured from the lower surface of the card enclosure or housing. The SAR "hot spot" 1508 is decreased as the height Hdc is increased. In actuality, only the high current region starting from the feed point and including the dipole arms needs to be raised, as beyond this point the SAR is typically much lower and hence the need for separation distance is less critical. In view of this, the dipole ends can be lowered to an appropriately satisfactory industrial design (ID). Such a design is depicted in FIG. 15d, in which the arms 1509 are raised, while the dipole ends 1511 are folded back down as shown. The feed plane is labeled 1513' and the hotspot is labeled 1508' in FIG. 15d. The top surface of the enclosure may be raised accordingly to accommodate the raised portions of the antenna, as shown. Furthermore, the location into which the PC card is mated in the side face of the laptop computer 1500 may be raised by a distance Hct to further separate the hotspot from the user during use, as when the laptop and PC card are resting on the users thighs.

The use of a top-loaded dipole also allows the overall antenna dipole arm length to be reduced, with that length being taken up by the dipole ends. However, reducing the arm length may cause the SAR to increase as the current becomes more concentrated near the feed point, so a compromise must be made. In the side view of FIG. 15e, the top-loading portion 1517 of the dipole is shown, with a meander line choke or inductor 1516 connecting to the dipole arm 1509' appearing in end view. This choke or inductor 1516 allows the antenna to be resonant at a lower frequency than without the choke. This therefore provides for a significant current density reduction by widening the arms 1509' of the dipole to a width Wda. This reduction in surface current density results in reduced SAR; however, the inductance decreases significantly as the width increases. For this reason the meander choke or inductor 1516 should be increased to restore the required resonance as necessary. Another expedient is to raise the location into which the PC card is mated in the side face of the laptop computer 1500 by a distance Hct to further separate the hotspot from the user during use, when the laptop and PC card are resting on the users thighs. The distance Hct may be taken from the lowest point of the host device (laptop computer), such as its bottom surface or the rest legs or points thereof.

In all, the SAR is mitigated by increasing separation distance Hdc+Hct between the body tissue of the operator and the dipole arms as desired, and a significant portion of this increase is attributable to an increased Hdc in the disclosed design. Moreover, the widening of the arms decreases the surface current density and, correspondingly, the SAR.

Figure 16A:
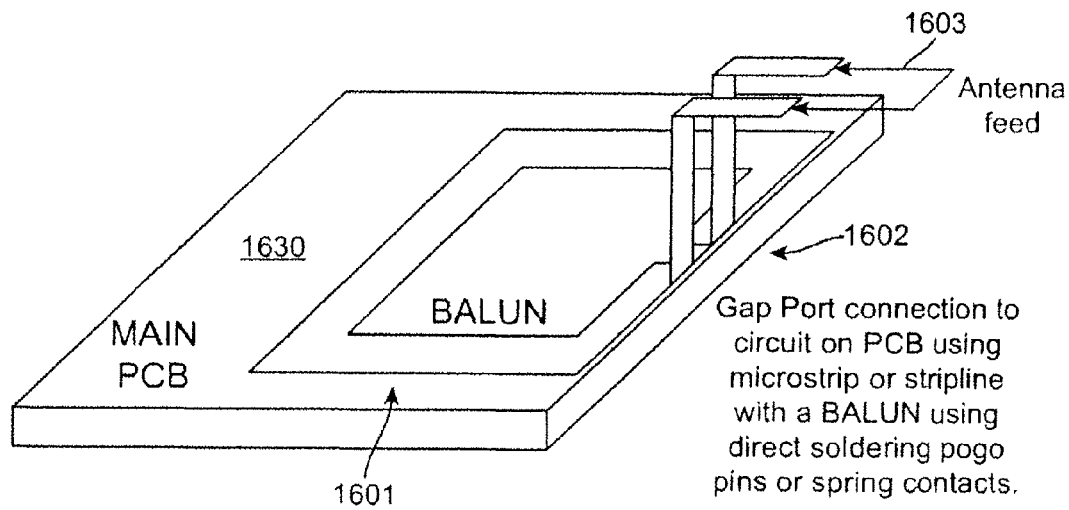
FIGS. 16a-16b show conventional balun type feeds.
Figure 16B:
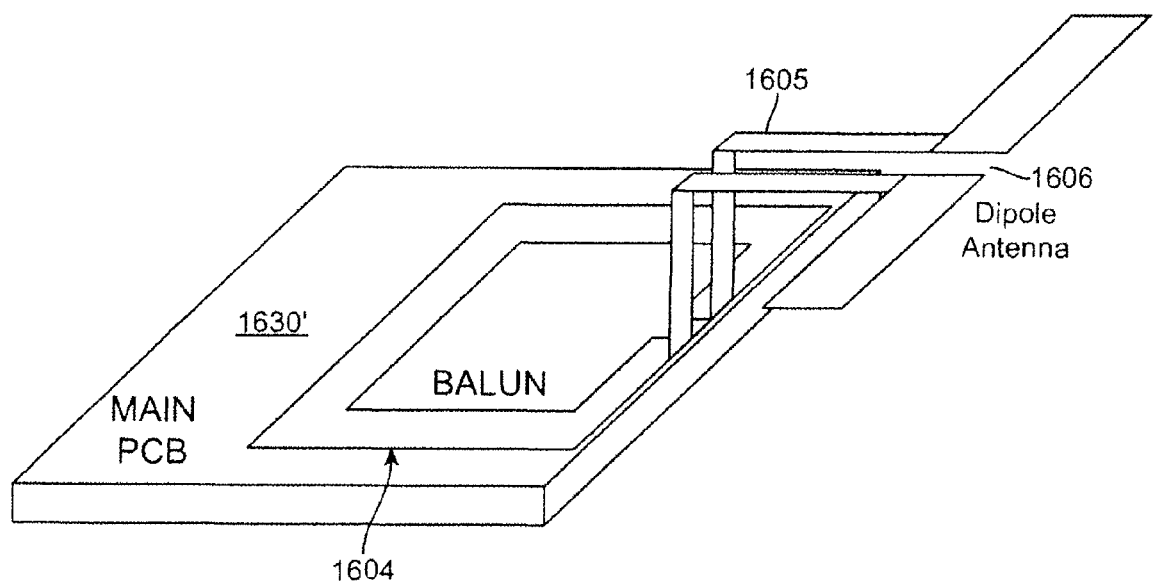
Figure 16C:
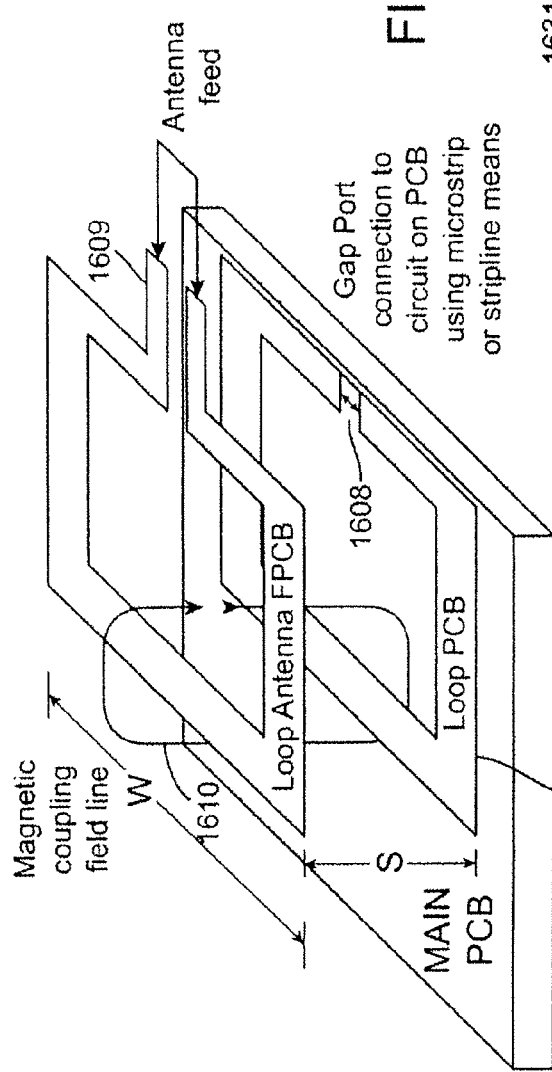
FIGS. 16c-16l show various inductive coupling configurations.

The consideration of inductive coupling between an antenna assembly and a printed circuit board (PCB) is discussed with reference to FIGS. 16c-16l. FIG. 16c shows a basic inductive coupling method in which a primary PCB loop 1607 is shown with a gap 1608 across which the signal is injected or sensed. The magnetic coupling 1610 shows the mutual coupling to a secondary loop 1609 that in turn connects directly to an antenna system (not shown) through feed 1609.

Figure 16D:
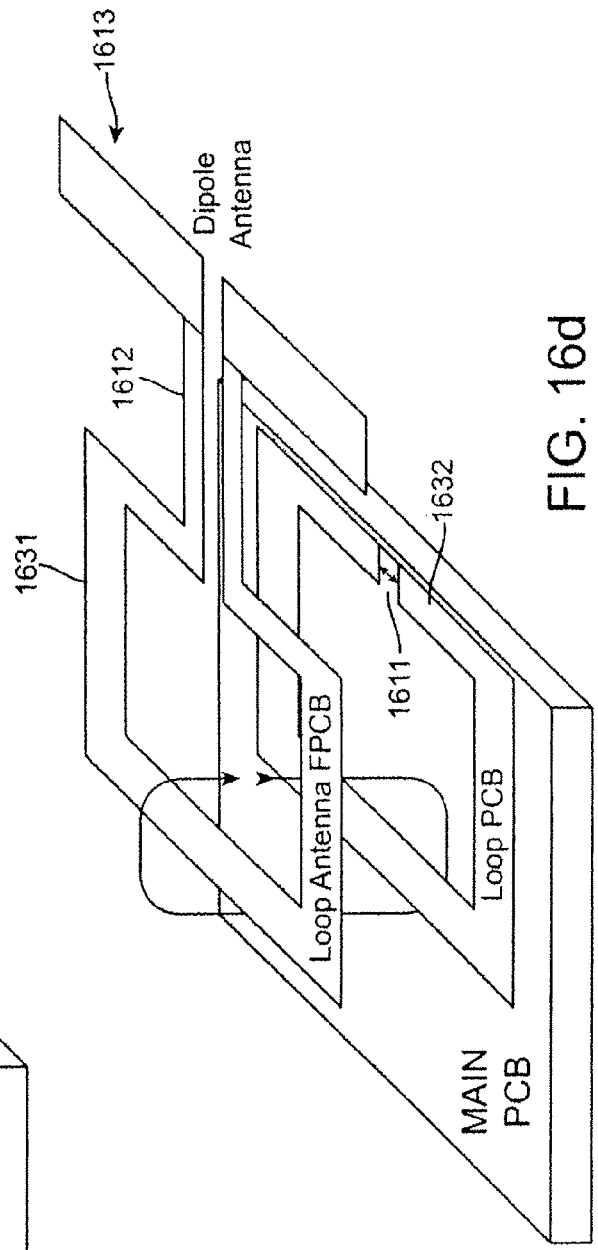

FIG. 16d shows a printed dipole 1613 connected to a secondary loop 1631 via a feed system 1612. The mutual coupling is sensed at the gap 1611 of the primary loop 1632. Of note is the width W of the printed loops and their separation distance S, as depicted in FIG. 16c. As long as the loop width W is substantially larger that the separation S between the two loops, the leakage inductance remains small relative to the mutual inductance. The mutual inductance increases as the circumference of the loops increases. It will be appreciated that this is a trade-off issue with size and adequate mutual coupling. Capacitive tuning or matching improves this coupling by cancelling out any reactive or susceptive components of the impedance or admittance. In some cases the separation S of the two loops 1631, 1632 may be significant—even being more than the width of the loops. In that case the leakage inductance becomes significant and may exceed the mutual inductance. Such leakage inductance can be tuned out with simple matching methods. The consequence is to increase the Q of the circuit and thereby decrease the usable coupling bandwidth. It is generally preferred that the two loops be substantially aligned one atop the other. To the extent this is not the case, the leakage inductance will increase. In some situations, the loops may be offset or side-by-side, which may satisfy application requirements at a cost to bandwidth.

Figure 16E:
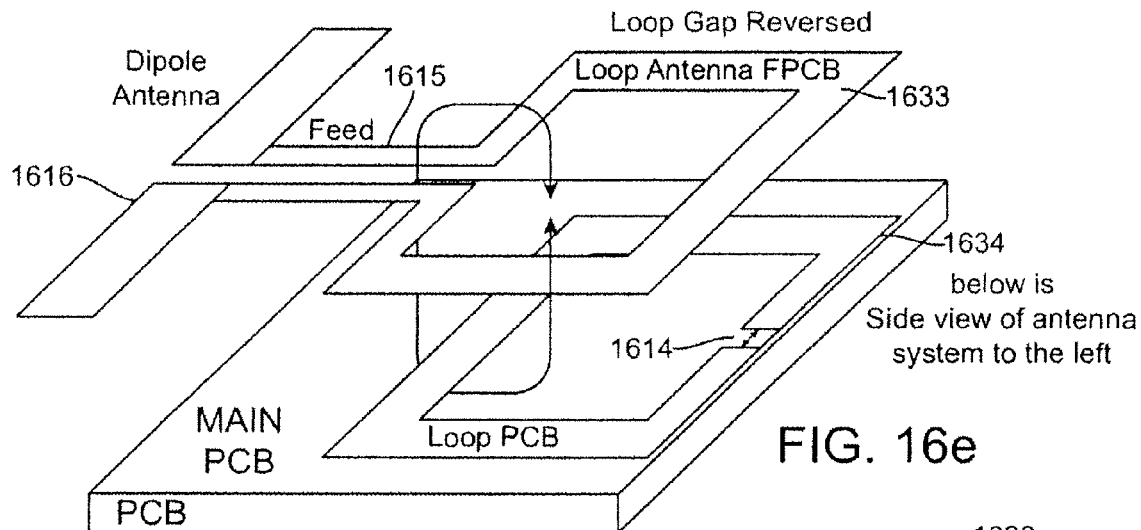
Figure 16F:
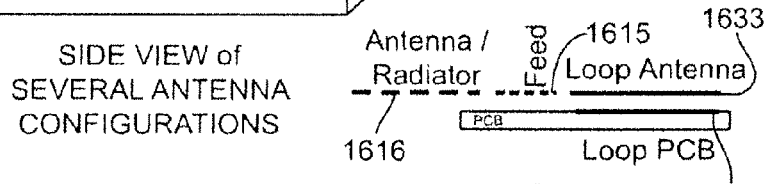

FIGS. 16e-16l show several implementations of an antenna inductive coupling, which may be a PCB-to-FPCB pair, or a PCB-to-stamped, etched or cut metallic antenna. It will be appreciated that the gaps in the two loops do not have to be coincident but may be anywhere, even as far as being opposite to each other as seen in FIG. 16e, wherein the dipole 1616 is coupled via the feed 1615 to the upper loop 1633, then inductively coupled to the lower loop 1634 with the output gap 1614 located in the opposite sense to the feed from feed system 1615. A side view of the antenna system of FIG. 16e is shown in FIG. 16f, with the lower loop on the main PCB, the upper loop on the FPCB or stamped metal connected via the feed to the dipole/radiator.

Figure 16G:
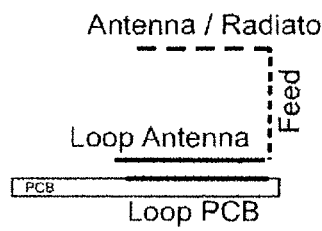
Figure 16H:
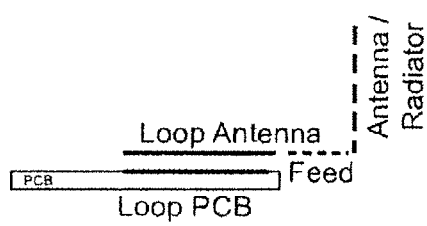
Figure 16I:
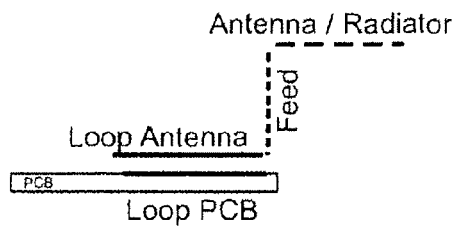
Figure 16J:
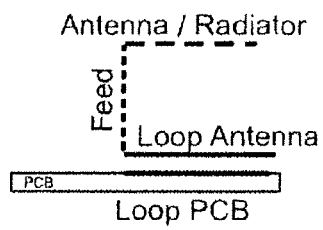
Figure 16K:
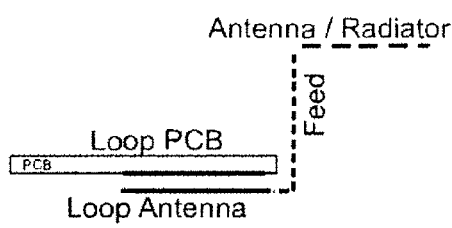
Figure 16L:
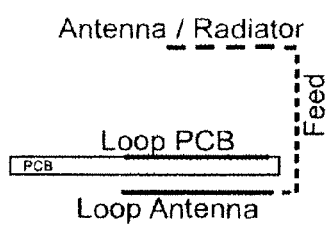
Figure 17A:
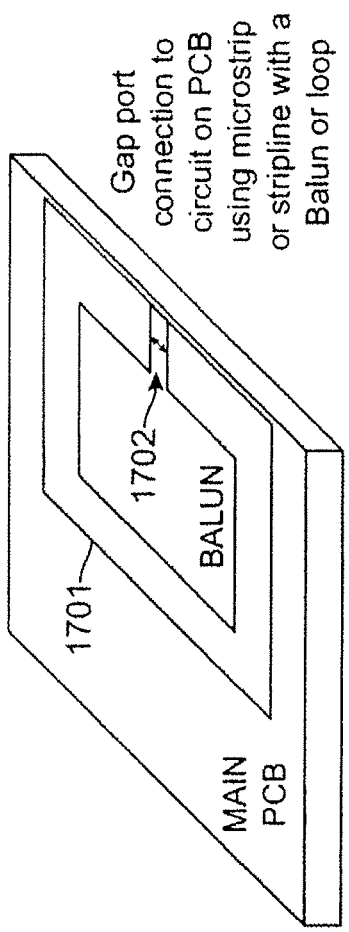
FIGS. 17a-17f show various prior art feed configurations for gap antennas.
Figure 17B:
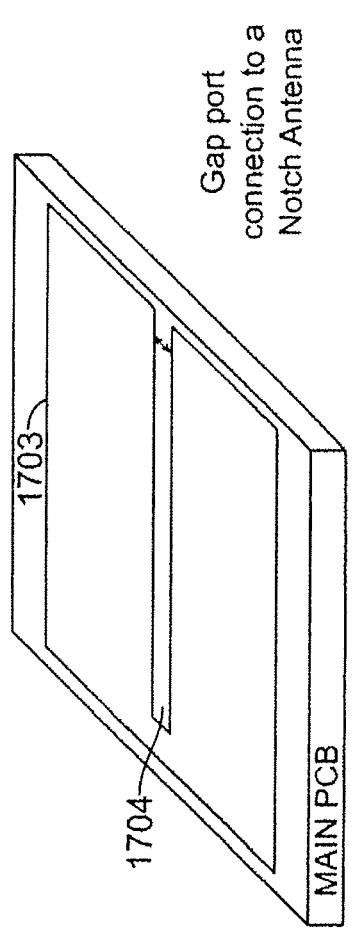
Figure 17C:
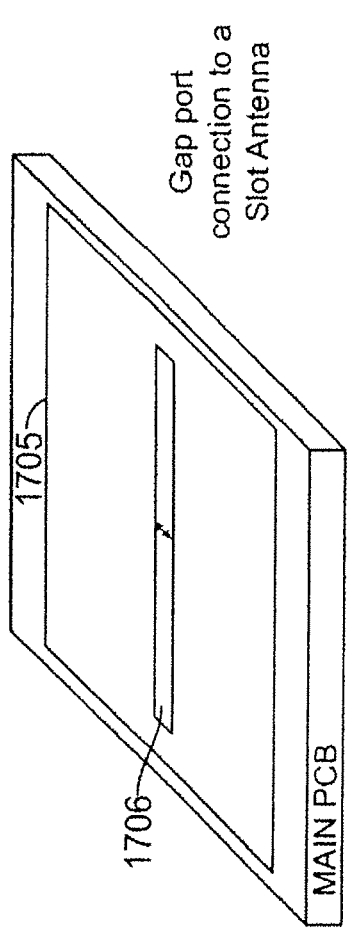
Figure 17D:
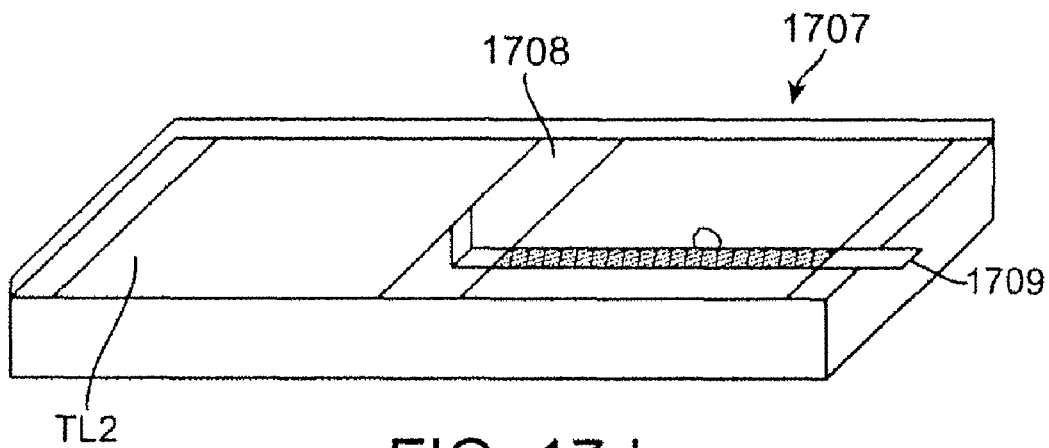
Figure 17E:
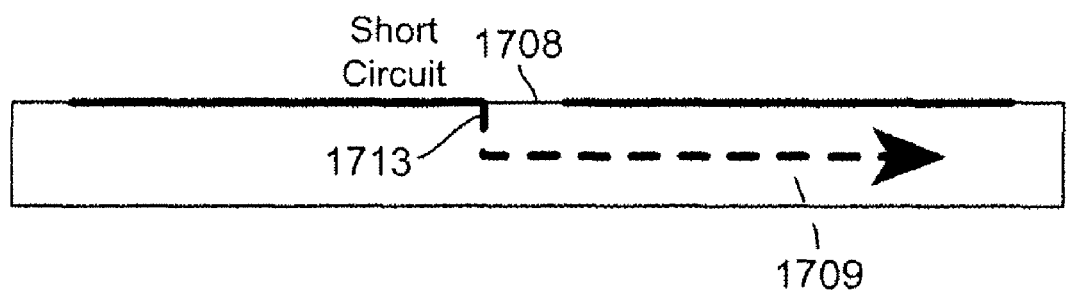
Figure 17F:
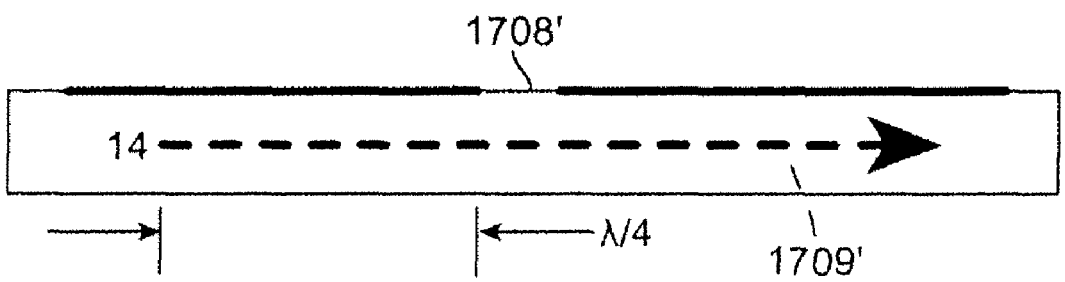

Several alternative configurations are shown in FIGS. 16g-16l. The placement of the dipole antenna clear and above the main PCB in FIG. 16g provides a more compact antenna and coupling solution, as seen in. Clearly height issues typical for dipoles above a ground plane are important here. A vertically (normal) disposed and maybe horizontal dipole is shown in FIG. 16h, with its coupling loop and feed system. A horizontal dipole with feed and coupling loop is also shown, in FIG. 16i. The antenna configuration of FIG. 16j shows a similar system to that in FIG. 16g above, except that the feed system is away from the card edge. This will affect both performance and mechanical issues. While antenna assemblies in FIGS. 16g-16j show the antenna coupling loop on top, in FIGS. 16k-16l, this is reversed, with the antenna coupling loop being disposed on the opposite side or bottom of the main PCB. Inductive coupling at RF between a PCB and a SAW chip with the intention of eliminating the wire bonds that would otherwise have been used is also possible.

Figure 18A:
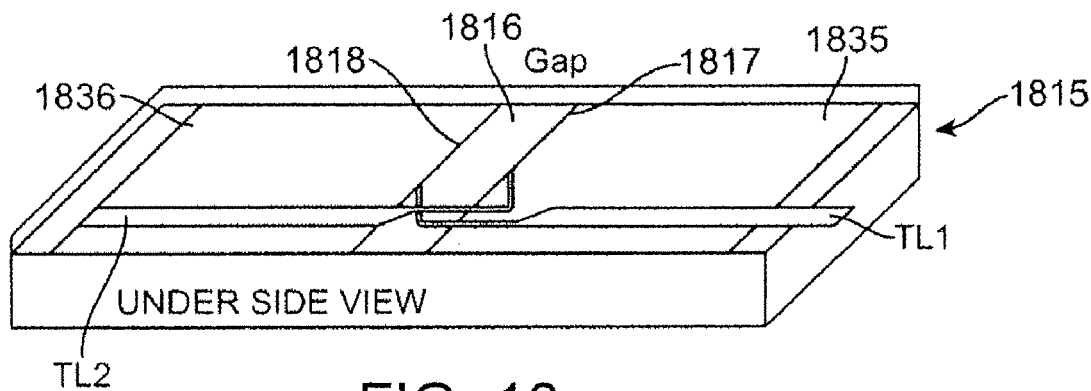
FIGS. 18a-18c relate to various feed configurations for a duplex antenna application.
Figure 18B:
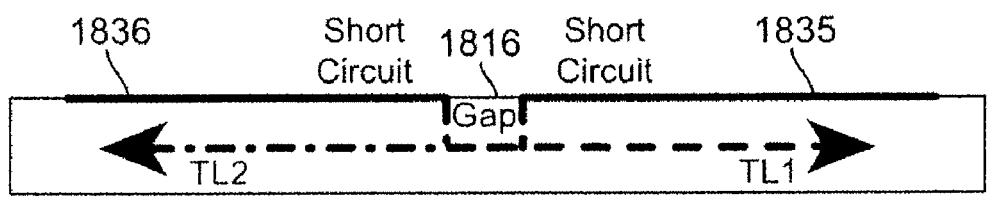
Figure 18C:
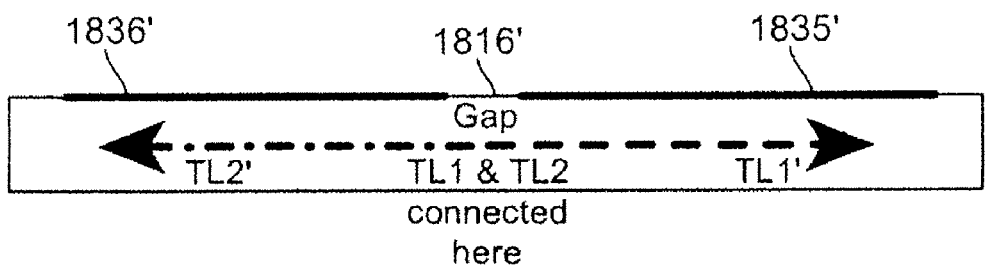

The consideration of dual band gap split duplexing and/or matching is discussed with reference to FIGS. 18-21. FIGS. 18a-18c show excitation of a gap 1816 in a waveguide structure 1815 from opposite sides. The gap 1816 lies between antenna portions 1835 and 1836. Sides 1817 and 1818 of gap 1816 are coupled to the strip lines TL1 and TL2, as seen in FIGS. 18a and 18b. The dual excitation provides a convenient duplexing or high band low band matching opportunity. In this case the two feeds split the high frequency to one side and the lower frequencies to the other. It is also possible to split multiple frequency bands to one side of the slot/gap and the other bands to the other side.

In FIGS. 18a and 18b, a configuration is shown in which the two transmission lines TL1 and TL2 are connected directly to the gap 1816 by short circuit couplings. In FIG. 18c, the gap 1816' is straddled by the strip line without any direct connection to the two transmission lines TL1' and TL2', in an open circuit coupling configuration. The two transmission lines TL1' and TL2' are joined to one another under the gap. Within a short distance or at a distance of an integral multiple of one half of a wavelength, band pass and/or appropriate band reject matching impedances or filters are used in order to achieve the required duplexing or match splitting, as described below.

Figure 19A:
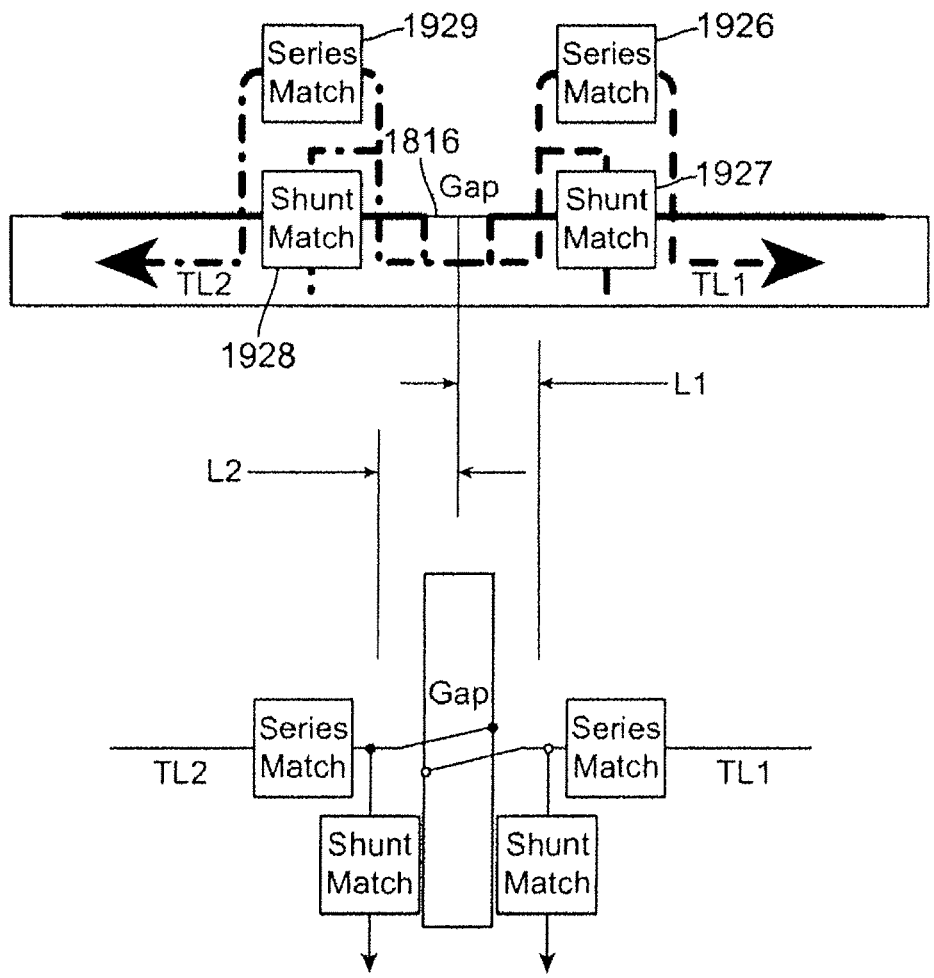
FIGS. 19a-19b relate to various matching configurations possible for the duplex antenna application.
Figure 19B:
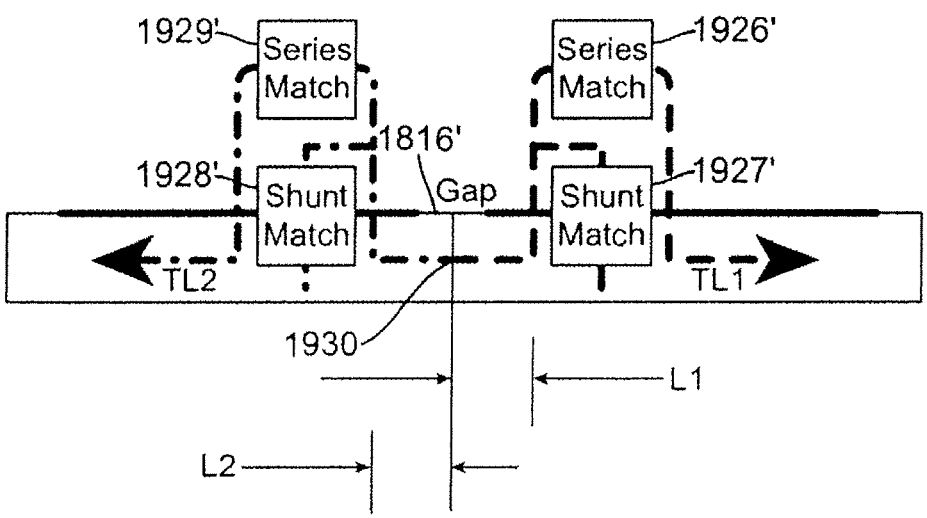

In FIGS. 19a-19b, a combination of shunt (1927 and 1928) and series (1926 and 1929) match elements are shown applied to the gap 1816 at the gap edges to provide the appropriate band pass and band reject conditions to achieve the desired match split or duplexing. The distances L1 and L2 from the gap center have a modifying effect on the band select conditions, and if it they are not made small then they should be considered in the matching conditions. One approach is to choose distances L1 and L2 of integer multiples of one half of a wavelength. The band reject impedances should appear as very high impedances at the required frequencies on the associated sides. In FIG. 19b, a similar arrangement is shown, but with gap 1816' not connected to the two feed systems. The two feed systems instead are joined under the gap at connecting point 1930. In this case the band reject impedances formed by the matches 1926', 1927', 1928' and 1929' should appear as very low impedances at the respective gap edges so that the cross coupling will properly function.

Figure 20:
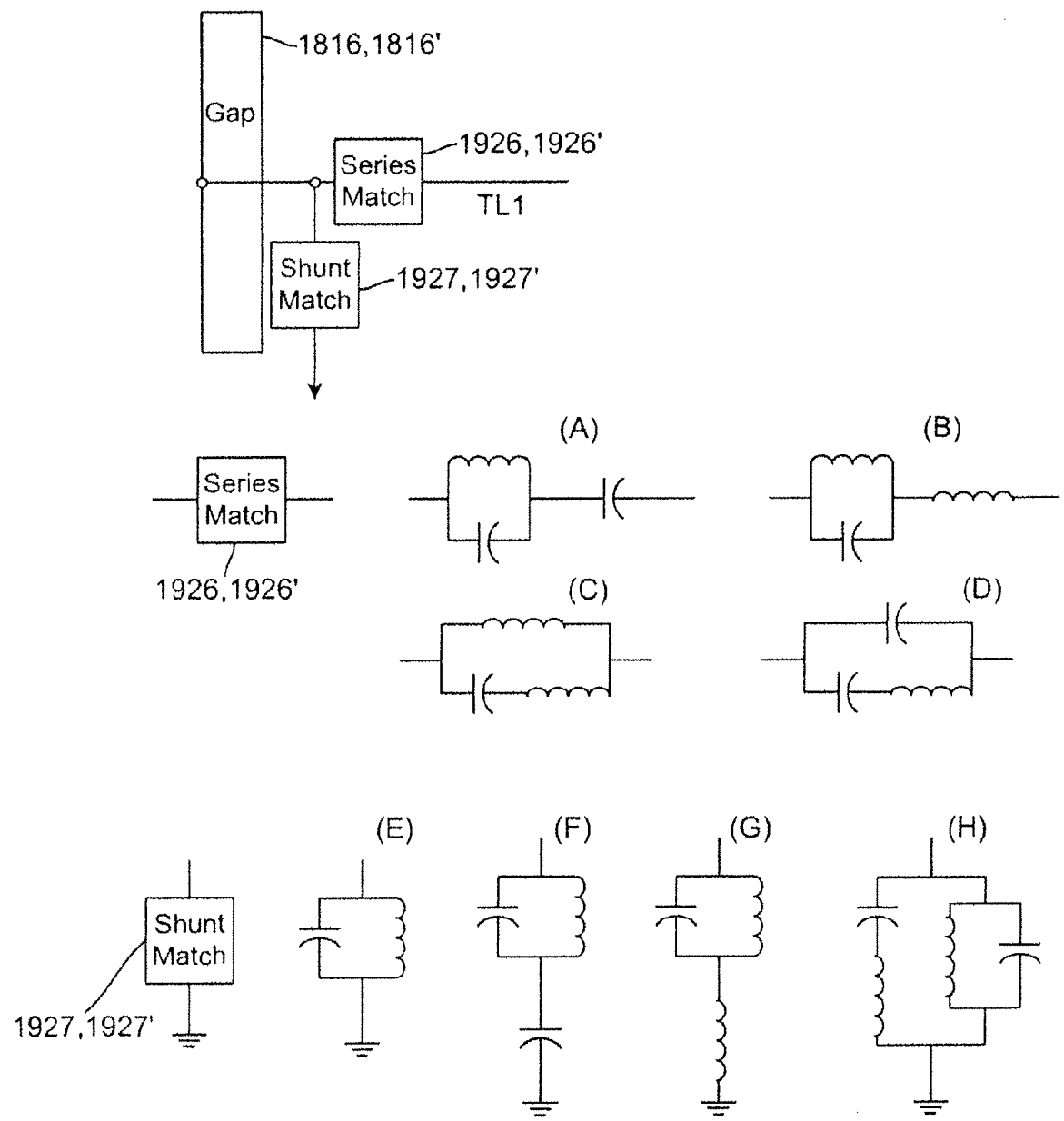
FIGS. 20a-20h show various matching elements that can be used.

FIG. 20 shows some of the possible band pass and band reject circuits that may be employed at the gaps 1816, 1816'. For ease of understanding only, one side illustrated; however, by extension the configuration for the opposite side can also be inferred. For example, several matching pass stop configurations have been shown for the matches. For the series matching 1926, 1926', any of the configurations A through D can be used. The series configuration should appear as a low impedance for the pass band and as a high impedance for the band stop, while the shunt match (1927, 1927') should supplement the series match to achieve the same result to the gap. Generally this means the shunt impedance will be normally high, suggesting it is only required for matching conditions. Examples of high impedance matches are shown in configurations E through H. Configuration H has a low impedance at the series resonance, which must not fall either in the required band stop or band reject region but is used to achieve matching conditions. If the transmission line passes under the gap then the band stop should have a very low impedance, as with configurations F through H in the shunt match in the stop band and a very high impedance in the pass band. While these arrangements focus on the split at the gap into two duplexed signals, these may be fed directly to independent Rx/Tx systems, or else recombined after matching to establish a unified matched signal.

Figure 21:
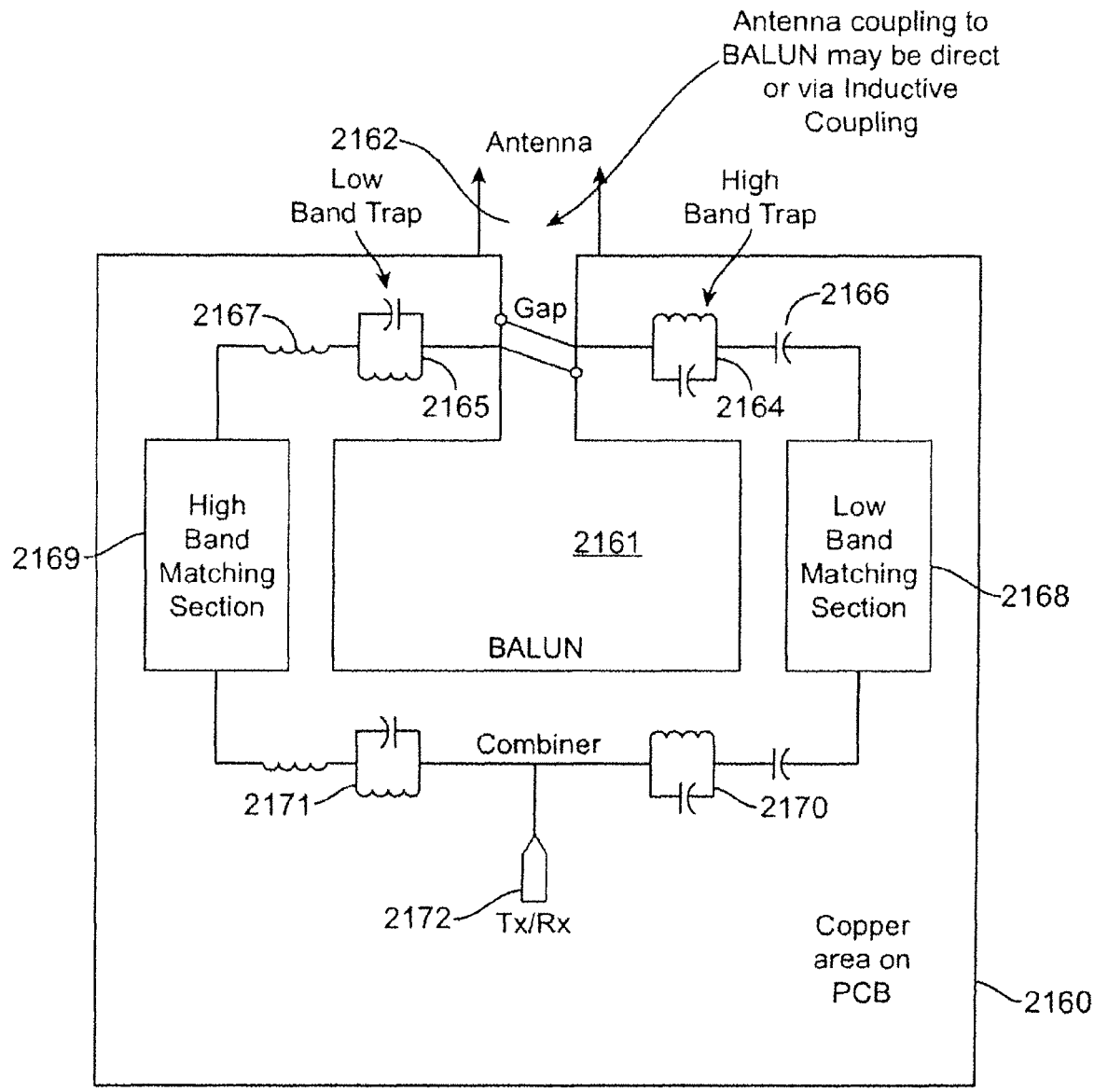
FIG. 21 shows a duplexer antenna with a balun feed.

FIG. 21 shows one embodiment configured as described herein. The copper (or other material) region 2160 contains a BALUN 2161 with a gap 2162 that is directly or inductively coupled to an antenna element (not shown). The low band signal is diverted from the gap 2162 to the right via a high band trap 2164 whose excess inductance in the low band is cancelled out using the series capacitor 2166. This signal is then matched to the desired matching conditions through the low band matching section 2168 and may be recombined via a similar trap arrangement 2170 to the common node 2172 that is connected to the Tx/Rx RF circuit on the PCB (not shown). The trap 2164 presents a high impedance to the high band and the trap on the left side (2165) presents a high impedance to the low band thus deflecting all the low band signal to the low band side. Similarly the high band signal is diverted from the gap 2162 to the left via the low band trap (2165) whose excess capacitance in the high band is cancelled out using the series inductor 2167. This high band signal is then matched to the desired matching conditions through the high band matching section 2169 and may be recombined via a similar trap arrangement 2171 to the common node 2172. Simplifications to the traps are possible using appropriate lengths of transmission line to achieve high impedance conditions at the frequency bands as described above.

The above are exemplary modes of carrying out the invention and are not intended to be limiting. It will be apparent to those of ordinary skill in the art that modifications thereto can be made without departure from the spirit and scope of the invention as set forth in the following claims.

What is claimed is:

1. A diversity antenna system for use with a host device and configured to provide isolation from radiated self-noise by the host device and to minimize interactions between antenna elements of the diversity antenna system, the diversity antenna system comprising:
    a ground plane;
    a main antenna coupled to the ground plane and having a common mode feed; and
    a diversity antenna having first and second arms extending from the common-mode feed of the main antenna.

2. The diversity antenna system of claim 1, wherein the main antenna is a balanced dipole antenna.

3. The diversity antenna system of claim 1, wherein the main antenna is coupled to the ground plane by way of a balun.

4. The diversity antenna system of claim 1, wherein the polarization of the main antenna is orthogonal to polarization of a common mode of the diversity antenna.

5. The diversity antenna system of claim 1, wherein the diversity antenna includes a gap between the first and second arms, said gap configured to substantially reduce odd mode excitation from the main antenna.

6. The diversity antenna system of claim 5, further comprising a power splitter configured to drive the first and second arms.

7. The diversity antenna system of claim 6, wherein the power splitter is a Wilkinson power splitter.

8. The diversity antenna system of claim 5, further comprising a matching circuit coupled across the gap between the first and second arms.

9. The diversity antenna system of claim 1, wherein the diversity antenna is a top loaded monopole.

10. The diversity antenna system of claim 1, wherein the host device is a laptop computer having a top face and having a side face to which the diversity antenna system is coupled, the main antenna being configured to extend substantially in parallel to said top face and said side face.

* * * * *